United States Patent
Chen

(10) Patent No.: US 11,315,653 B2
(45) Date of Patent: Apr. 26, 2022

(54) DYNAMIC RANDOM ACCESS MEMORY AND METHOD THEREOF

(71) Applicant: NANYA TECHNOLOGY CORPORATION, New Taipei (TW)

(72) Inventor: Chih-Jen Chen, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/039,515

(22) Filed: Sep. 30, 2020

(65) Prior Publication Data

US 2022/0101936 A1   Mar. 31, 2022

(51) Int. Cl.
| | |
|---|---|
| *G11C 29/14* | (2006.01) |
| *G11C 29/12* | (2006.01) |
| *G11C 29/44* | (2006.01) |
| *G06F 11/30* | (2006.01) |

(52) U.S. Cl.
CPC .......... *G11C 29/14* (2013.01); *G06F 11/3037* (2013.01); *G11C 29/12005* (2013.01); *G11C 29/44* (2013.01)

(58) Field of Classification Search
None
See application file for complete search history.

(56) References Cited

U.S. PATENT DOCUMENTS

| | | | | |
|---|---|---|---|---|
| 7,042,799 | B2 * | 5/2006 | Cho | G11C 7/1078 365/185.17 |
| 10,573,371 | B2 * | 2/2020 | Takahashi | G11C 11/4096 |
| 10,832,754 | B1 * | 11/2020 | Hopper | G06F 11/3065 |
| 10,902,890 | B2 * | 1/2021 | Bains | G11C 11/4096 |
| 10,916,327 | B1 * | 2/2021 | He | G11C 29/50 |
| 2020/0341847 | A1 * | 10/2020 | Boehm | G06F 11/3037 |

\* cited by examiner

*Primary Examiner* — Phung M Chung
(74) *Attorney, Agent, or Firm* — Muncy, Geissler, Olds & Lowe, PC

(57) ABSTRACT

The present disclosure provides a dynamic random access memory (DRAM) and method for controlling the DRAM. The DRAM has a first operation mode and a second operation mode. The DRAM includes a control module and a connecting module. The connecting module includes an input/output (I/O) pad and a determining circuit. The I/O pad is configured to receive a first input signal. The determining circuit includes a detector and a first determining unit. The detector is configured to compare the first input signal to a reference signal so as to generate a first signal. The first determining unit is configured to receive the first signal and generate a first output signal according to the first signal. The control module is configured to control the DRAM being operated under the first operation mode or the second operation mode according to the first output signal.

20 Claims, 29 Drawing Sheets

| OC1 | | | |
|---|---|---|---|
| IN1 | IN2 | IN3 | OUT1 |
| VSS/VDD | 0 | 1 | 1 |
| VSS/VDD | 1 | 1 | 1 |
| VSS/VDD | 1 | 0 | 0 |
| VSS/VDD | 0 | 0 | 0 |
| VTM | 0 | 0 | 0 |
| VTM | 0 | 1 | 0 |
| VTM | 1 | 0 | 0 |
| VTM | 1 | 1 | 1 |

| IN1 | IN4 | OUT2 |
|-----|-----|------|
| VSS | 0 | 0 |
| VSS | 1 | 0 |
| VDD | 0 | 1 |
| VDD | 1 | 1 |
| VTM | 0 | 0 |
| VTM | 1 | 1 |

FIG. 23

DYNAMIC RANDOM ACCESS MEMORY AND METHOD THEREOF

TECHNICAL FIELD

The present disclosure relates to a dynamic random access memory (DRAM) and a method thereof, and more particularly, to a DRAM and a method for controlling the DRAM being operated under different operation modes.

DISCUSSION OF THE BACKGROUND

The operation speed of a conventional dynamic random access memory (DRAM) is improved fast, and the commands for DRAM are designed with different modes which have different operation speeds. When a DRAM undergoes a testing process, the DRAM receives a command to be tested at a default operation mode. However, the testing process may be operated more efficiently at other operation mode. When the testing process is performed under an unappropriated operation mode, the time cost for testing process increases. Therefore, improving the efficiency of testing process for DRAM becomes a critical issue in this field.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a dynamic random access memory (DRAM) having a first operation mode and a second operation mode, including a control module and a connecting module. The connecting module includes an input/output (I/O) pad and a determining circuit. The I/O pad is configured to receive a first input signal. The determining circuit includes a detector and a first determining unit. The detector is configured to compare the first input signal to a reference signal so as to generate a first signal. The first determining unit is configured to receive the first signal and generate a first output signal according to the first signal. The control module is configured to control the DRAM being operated under the first operation mode or the second operation mode according to the first output signal.

In some embodiments, when the first output signal has a first logic level, the control module controls the memory array being operated under the first operation mode, and when the first output signal has a second logic level, the control module controls the DRAM being operated under the second operation mode.

In some embodiments, when a voltage level of the first input signal is lower than a voltage level of the reference signal, the detector generates the first signal having a first logic level, and when the voltage level of the first input signal is higher than the voltage level of the reference signal, the detector generates the first signal having a second logic level.

In some embodiments, the first determining unit is further configured to receive a second input signal and generate the first output signal according to both of the first signal and the second input signal.

In some embodiments, when the first signal has the second logic level and the second input signal has the first logic level, the first determining unit generates the first output signal to make the DRAM be operated under the first operation mode.

In some embodiments, the first determining unit is further configured to receive a third input signal and generate the first output signal according to the first signal, the second input signal, and the third input signal.

In some embodiments, when the first input signal has the second logic level and the third input signal has the first logic level, the first determining unit generates the first output to make the DRAM be operated under the first operation mode.

In some embodiments, when the first input signal, the second input signal, and the third input signal have the second logic level, the first determining unit generates the first output signal to make the DRAM be operated under the second operation mode.

In some embodiments, the first determining unit includes a first NAND gate, a second NAND gate, a first inverter, and a second inverter. The first NAND gate has a first input port, a second input port, and an output port. The second NAND gate has a first input port, a second input port, and an output port. The first inverter has an input port and an output port. The second inverter has an input port and an output port. The first input port of the first NAND gate is coupled to the detector and configured to receive the first signal, the second input port of the first NAND gate is coupled to the output port of the first inverter, the output port of the first NAND gate is coupled to the first input port of the second NAND gate, the input port of the first inverter is configured to receive the second input signal, the second input port of the second NAND gate is configured to receive the third input signal, the output port of the second NAND gate is coupled to the input port of the second inverter, and the output port of the second inverter is configured to output the first output signal.

In some embodiments, the determining circuit further includes a receiver and a second determining unit. The receiver is configured to receive the first input signal and generate a second signal according the first input signal. The second determining unit is configured to receive the first signal and the second signal, and configured to generate a second output signal according to the first signal and the second signal. The control module is configured to control the connecting module being tested according to the second output signal.

In some embodiments, when a voltage of the input signal is lower than a voltage of a reference signal, the receiver generates the second signal having a first logic level, and when the voltage of the input signal is substantial equal to the voltage level of the reference signal, the receiver generates the second signal having the second logic level.

In some embodiments, the second determining unit is further configured to receive a fourth input signal and generate the second output signal according to all of the first signal, second signal, and the fourth input signal. When the first signal and the second signal have the first logic level, the second determining unit generates the second output signal to make the connecting module not be tested, when the first signal has the first logic level and the second signal has the second logic level, the second determining unit generates the second output signal to make the connecting module be tested, when the first signal and the second signal have the second logic level, and the fourth signal has the first logic level, the second determining unit generates the second output signal to make the connecting module not be tested, and when the first signal, the second signal, and the fourth input signal has the second logic level, the second determining unit generates the second output signal to make the connecting module be tested.

In some embodiments, the second determining unit includes a third NAND gate, a fourth NAND gate, a third inverter, and a fourth inverter. The third NAND gate has a first input port, a second input port, and an output port. The fourth NAND gate has a first input port, a second input port, and an output port. The third inverter has an input port and an output port. The fourth inverter has an input port and an output port. The first input port of the third NAND gate is coupled to the detector and configured to receive the first signal, the second input port of the third NAND gate is coupled to the output port of the third inverter, the output port of the third NAND gate is coupled to the second input port of the fourth NAND gate, the input port of the third inverter is configured to receive the fourth input signal, the first input port of the fourth NAND gate is coupled to the receiver and configured to receive the second signal, the output port of the fourth NAND gate is coupled to the input port of the fourth inverter, and the output port of the fourth inverter is configured to output the second output signal.

In some embodiments, the first operation mode is 1N mode of double data rate fifth-generation synchronous dynamic random access memory (DDR5 SDRAM), and the second operation mode is 2N mode of DDR5 SDRAM.

Another aspect of the present disclosure provides a method for controlling the DRAM. The method includes: receiving, by an I/O pad of a connecting module of the DRAM, a first input signal; generating a first signal according to a voltage level of the first input signal and a voltage level of a reference signal; and generating, according to the first signal, a first output signal to control the DRAM being operated under a first operation mode or a second operation mode. When the first output signal having a first logic level, the DRAM is controlled to be operated under the second operation mode, and when the first output signal having a second logic level, the DRAM is controlled to be operated under the first operation mode.

In some embodiments, the operation of generating the first signal according to the voltage level of the first input signal and the level of the reference signal includes: comparing the voltage level of the first input signal to the voltage level of the reference signal; when the voltage level of the first input signal is lower than the voltage level of the reference signal, generating the first signal having the second logic level; and when the voltage level of the first input signal is greater than the voltage level of the reference signal, generating the first signal having the first logic level.

In some embodiments, the operation of generating the first output signal includes: receiving a second input signal; and generating a second signal according to the first signal and the second input signal.

In some embodiments, the operation of generating the first output further includes: receiving a third input signal; generating a third signal according to the second signal and the third input signal; and generating the first output signal according to the third signal. When the first input signal, the second input signal, and the third input signal have the first logic level, the DRAM is controlled to be operated under the second operation mode. When the first signal having the first logic level, the second input signal having the second logic level, and the third input signal having the second logic level are achieved, the DRAM is controlled to be operated under the first operation mode. When the first signal having the first logic level, the second input signal having the first logic level, and the third input signal having the second logic level are achieved, the DRAM is controlled to be operated under the first operation mode. When the first signal having the first logic level, the second input signal having the second logic level, and the third input signal having the first logic level are achieved, the DRAM is controlled to be operated under the first operation mode.

In some embodiments, the method further includes: generating a second output signal according to the first input signal, which includes: generating a fourth signal according to the first input signal; receiving a fourth input signal; generating a fifth signal according to the first signal, the fourth signal, and the fourth input signal; and generating the second output signal according to the fifth signal. The connecting module is controlled to be tested according the second output signal.

In some embodiments, when the first signal and the fourth signal have the second logic level, the second output signal is generated to make the connecting module not be tested. When the first signal has the second logic level and the fourth signal has the first logic level, the second output signal is generated to make the connecting module be tested. When the first signal, the fourth signal, and the fourth input signal have the first logic level, the second output signal is generated to make the connecting module be tested. When the first signal and the fourth signal have the first logic level, and the fourth input signal has the second logic level, the second output signal is generated to make the connecting module not be tested.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

FIG. 16 is an operating chart of operations of the determining of the determining circuit of the connecting module of the DRAM according to some embodiments of the present disclosure.

FIG. 23 is an operating chart of operations of the determining of the determining circuit of the connecting module of the DRAM according to other embodiments of the present disclosure.

DETAILED DESCRIPTION

Figure 1:
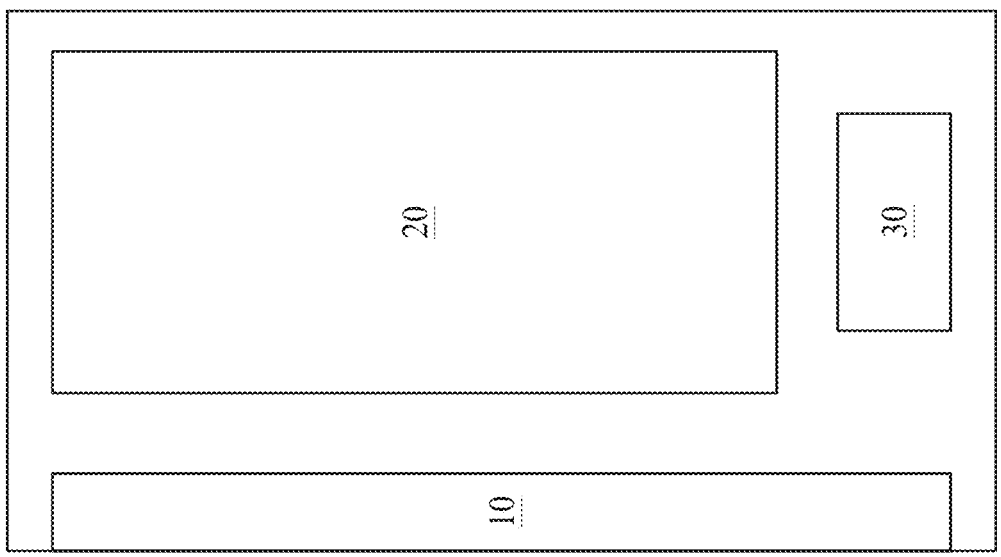
FIG. 1 is a schematic diagram of a dynamic random access memory (DRAM) according to some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic diagram of a dynamic random access memory (DRAM) 1 according to some embodiments of the present disclosure. The DRAM 1 includes a connecting module 10, a memory array 20, and a control module 30. The connecting module 10 is configured to connect signals and supply power to the DRAM1. The memory array 20 is configured to store data and controlled by the control module 30 in accordance with the signals and supply powers.

In some embodiments, the DRAM 1 is a double data rate (DDR) synchronous DRAM (SDRAM), and the connecting module 10, the memory array 20, and the control module 30 are designed to comply with the DDR DRAM specification. For example, the DRAM 1 is a double data rate fifth-generation (DDR5) SDRAM.

In some embodiments, the DRAM 1 can be operated under a first operation mode and a second operation mode, for example, the 1N mode and the 2N mode defined in the DDR5 SDRAM specification. The DRAM 1 has different speeds for operating the commands in different modes. Further, the commands sent in the first operation mode are different from the commands sent in the second operation mode.

Traditionally, when the DRAM being operated is switched modes, the DRAM must have to receive a multi-purpose command (MPC) and be controlled to switch from the one operation mode to the another operation mode. When the DRAM is going to be tested, the DRAM will be tested under a default operation mode, for example, the default operation mode in DDR5 SDRAM is 2N mode. However, the commands in the default operation mode may be operated less efficient than in the other mode. Under this condition, the testing for the DRAM is time consuming and may waste unnecessary time cost.

Compared to the traditional way, the DRAM 1 provided by the present disclosure can be switched modes easily, and the testing can be performed more efficiently.

Figure 2:
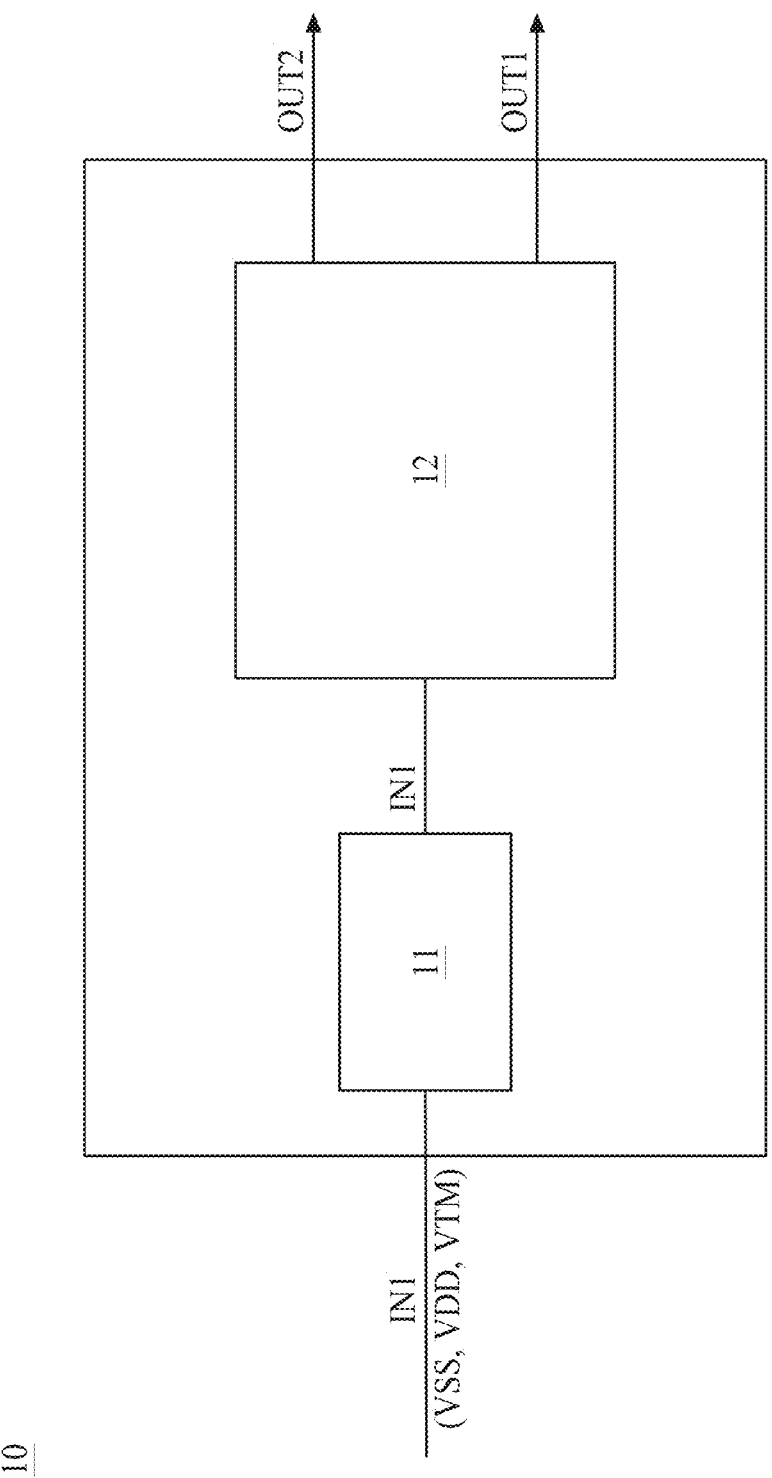
FIG. 2 is a schematic diagram of a connecting module of the DRAM according to some embodiments of the present disclosure.

Reference is made to FIG. 2. FIG. 2 is a schematic diagram of the connecting module 10 according to some embodiments of the present disclosure. The connecting module 10 includes an input/output (I/O) pad 11 and a determining circuit 12. The I/O pad 11 is arranged at the edge of the DRAM 1 for receiving or transmitting signals and/or supply powers, and the determining circuit 12 is coupled to the I/O pad.

In FIG. 2, the I/O pad 11 is configured to receive an input signal IN1 and transmit the input signal IN1 to the determining circuit 12. In some embodiments, the I/O pad 11 is a metal pad, such as copper pad. The determining circuit 12 is configured to receive the input single IN1, and generated an output signal OUT1 and an output signal OUT2 according to the input signal IN1.

In some embodiments, the input signal IN1 has a power supply voltage. The power supply voltage can be provided at a voltage VSS, a voltage VDD, and/or a voltage VTM. In some embodiments, the voltage VSS is ground, the voltage VDD is about 1.1V, and the voltage VTM is about 3.3V.

In some embodiments, the output signal OUT1 is generated to control the DRAM 1 being operated under the first operation mode or the second operation mode. When the output signal OUT1 has a logic low level (i.e., logic 0), the DRAM 1 will be operated under the first operation mode. When the output signal OUT1 has a logic high level (i.e., logic 1), the DRAM 1 will be operated under the second operation mode.

In some embodiments, the output signal OUT2 is generated to control whether the connecting module 10 being subjected to a connectivity test. When the output signal OUT2 has the logic high level, the connectivity test is conducted on the connecting module 10. When the output signal OUT2 has the logic low level, the connectivity test is not going to be conducted on the connecting module 10.

Figure 3:
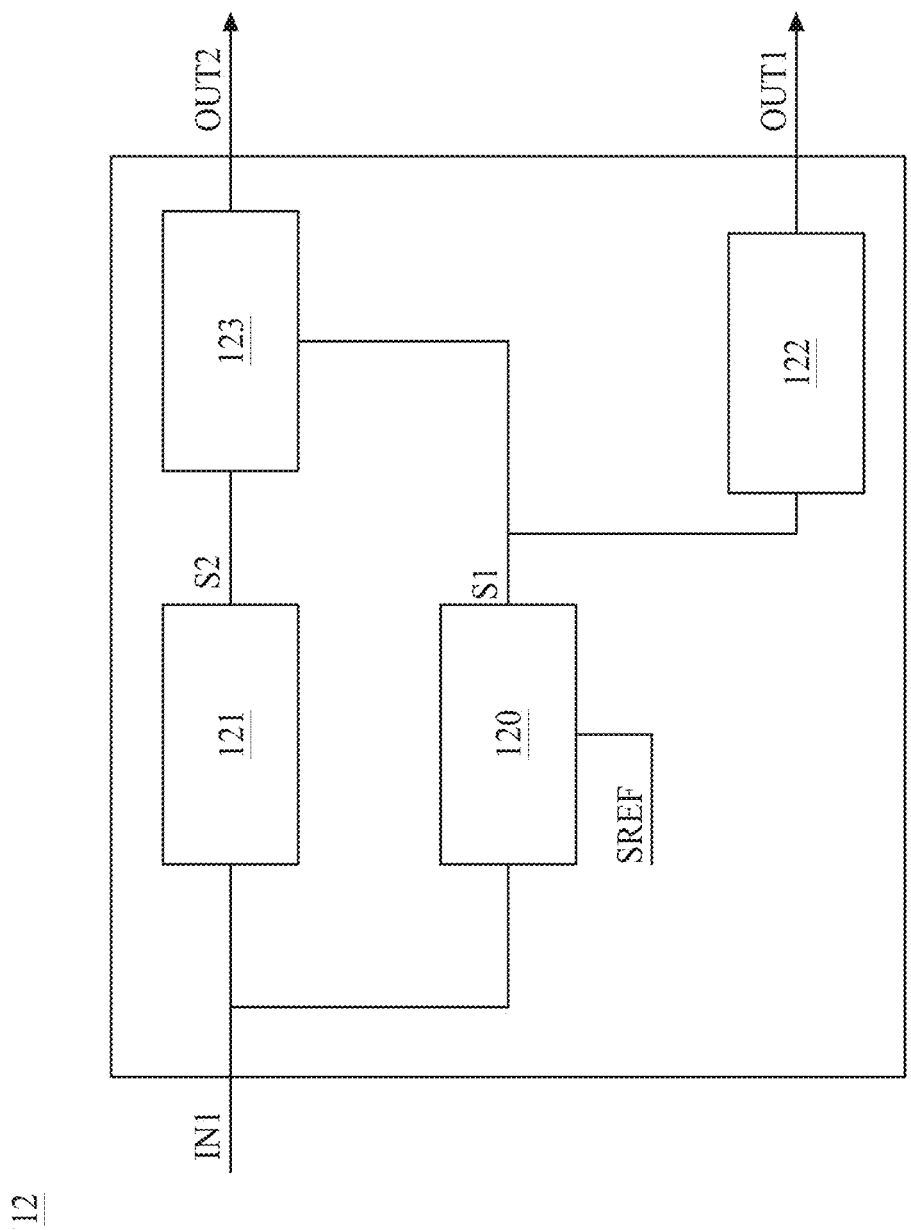
FIG. 3 is a schematic diagram of a determining circuit of the connecting module of the DRAM according to some embodiments of the present disclosure.

Reference is made to FIG. 3. FIG. 3 is a schematic diagram of the determining circuit 12 according to some embodiments of the present disclosure. The determining circuit 12 includes a detector 120, a receiver 121, a determining unit 122, and a determining unit 123. The detector 120 and the receiver 121 are configured to receive the input signal IN1 and generate a signal S1 and a signal S2, respectively. The determining unit 122 is coupled to the detector 120. The determining unit 123 is coupled to the detector 120 and the receiver 121.

The detector 120 generates the signal S1 according to the input signal IN1. When the input signal IN1 has the voltage VSS or the voltage VDD, the signal S1 is generated to have the logic low level. When the input signal IN1 has the voltage VTM, the signal S1 is generated to have the logic high level. In some embodiments, the detector 120 is implemented by a comparator. The detector 120 compares the received input signal IN1 to a reference signal SREF. When a voltage level of the input signal IN1 is not greater than a voltage level of the reference signal SREF, the signal S1 is generated to have the logic low level. When the voltage level of the input signal IN1 is greater than the voltage level of the reference signal SREF, the signal S1 is generated to have the logic high level. In some embodiments, the reference signal SREF has the voltage VDD.

The determining unit 122 is configured to receive the signal S1 and generate the output signal OUT1 according to the signal S1. The DRAM 1 is controlled by the output signal OUT1 having the logic high level and operated under the second operation mode. In contrast, the DRAM 1 is controlled by the output signal OUT1 having the logic low level and operated under the first operation mode.

The receiver 121 generates the signal S2 according to the input signal IN1. When the input signal IN1 has the voltage VSS, the signal S2 is generated to have the logic low level. In some embodiments, the receiver 121 includes buffers and a comparator.

The determining unit 123 is configured to receive the signal S1 and the signal S2, and generate the output signal OUT2 according to the signal S1 and the signal S2. When the signal S1 and the signal S2 have the logic low level (i.e., the input signal IN1 has the voltage VSS), the output signal OUT 2 is generated to have the logic low level. The connectivity test is not conducted to the connecting module 10. In contrast, when the signal S1 has the logic low level and the signal S2 have the logic high level (i.e., the input signal IN1 has the voltage VDD), the output signal OUT 2 is generated to have the logic high level. The connectivity test is conducted to the connecting module 10.

The above configuration of the determining circuit 12 is provided for illustrative purposes. Various configurations of the determining circuit 12 are within the contemplated scope. For example, in various embodiments, the determining circuit 12 further receives more input signals as illustrated in FIG. 4.

Figure 4:
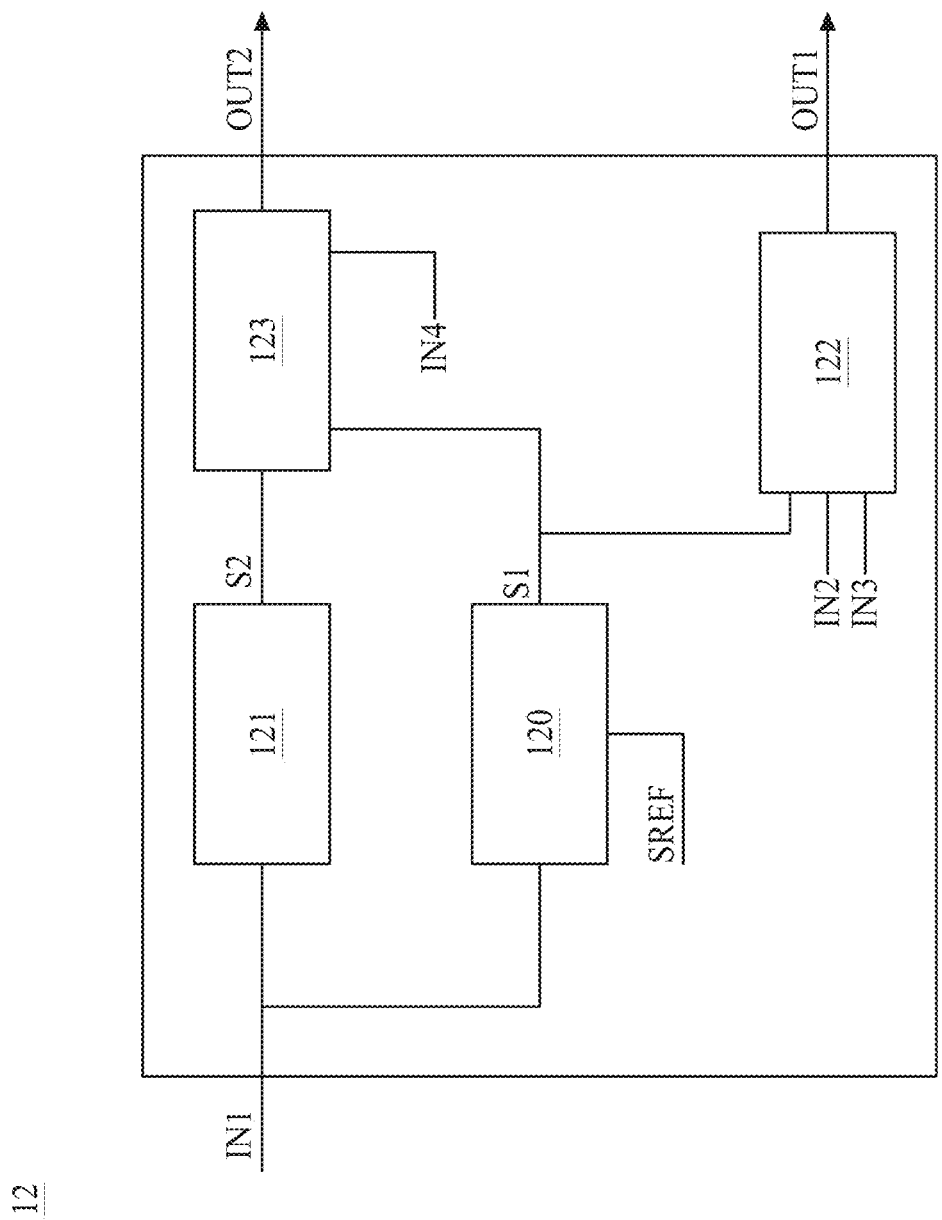
FIG. 4 is a schematic diagram of a determining circuit of the connecting module of the DRAM according to various embodiments of the present disclosure.

Reference is made to FIG. 4. FIG. 4 is a schematic diagram of the determining circuit 12 according to various embodiments of the present disclosure. To facilitate understanding, the similar elements are designated with the same numerals. The determining circuit 12 includes the detector 120, the receiver 121, the determining unit 122, and the determining unit 123. As illustrated in FIG. 4, the determining unit 122 is further configured to receive an input signal IN2 and an input signal IN3, and the determining unit 123 is further configured to receiver an input signal IN4. Therefore, the determining unit 122 is configured to generate the output signal OUT1 according to the input signals IN1, IN2, and IN3, and the determining unit 123 is configured to generate the output signal OUT2 according to the input signals IN1 and IN4. The operations of the determining circuit 12 corresponding to the input signals IN1, IN2, IN3, and IN4 are described with reference to FIG. 5 to FIG. 16 below.

Figure 5:
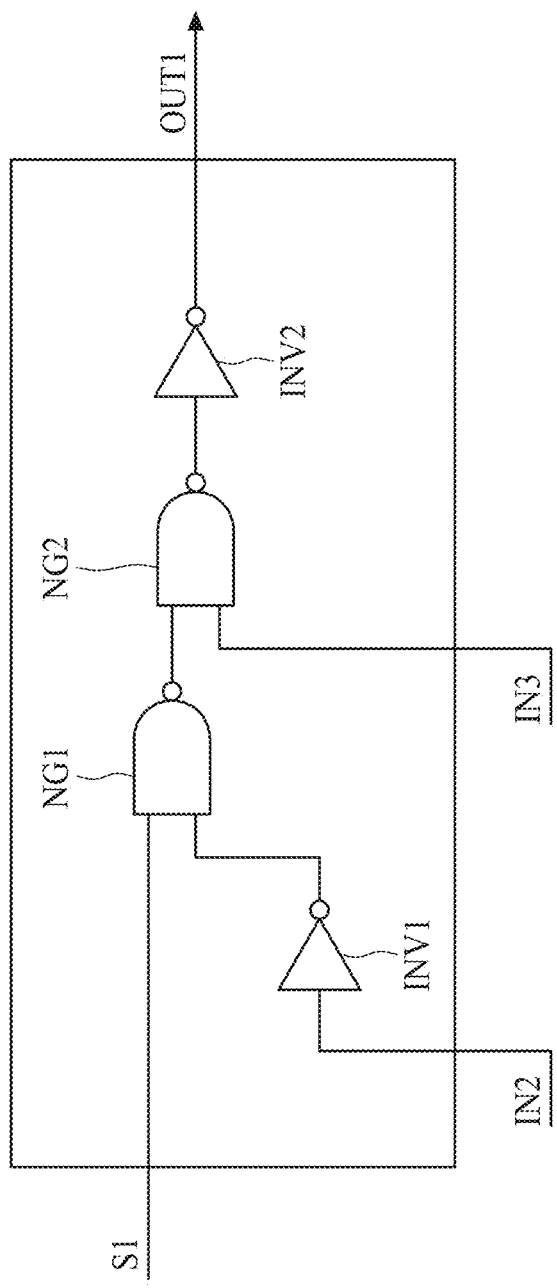
FIG. 5 is a schematic diagram of a determining unit of the determining circuit according to some embodiments of the present disclosure.

Reference is made to FIG. 5. FIG. 5 is a schematic diagram of the determining unit 122 according to some embodiments of the present disclosure. The determining unit 122 includes a NAND gate NG1, a NAND gate NG2, an inverter INV1, and an inverter INV2. As illustrated in FIG. 5, a first input port of the NAND gate NG1 is configured to receive the signal S1, the second input port of the NAND gate NG1 is coupled to an output port of the inverter INV1, an output port of the NAND gate NG1 is coupled to a first input port of the NAND gate NG2, an input port of the inverter INV1 is configured to receive the input signal IN2, a second input port of the NAND gate NG2 is configured to receive the input signal IN3, an output port of the NAND gate NG2 is coupled to an input port of the inverter INV2, and an output port of the inverter INV2 is configured to output the output signal OUT1.

Figure 6:
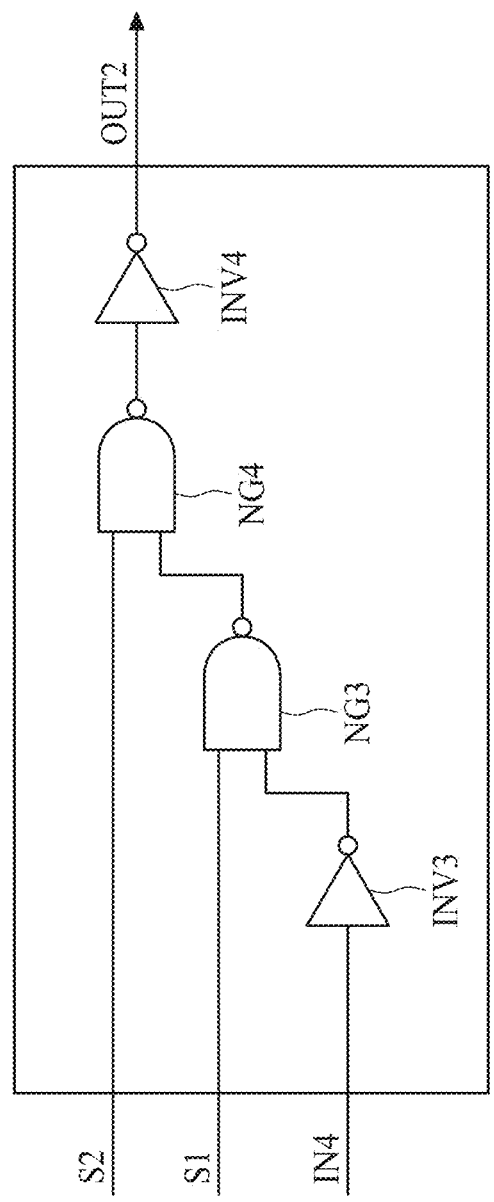
FIG. 6 is a schematic diagram of a determining unit of the determining circuit according to some embodiments of the present disclosure.

Reference is made to FIG. 6. FIG. 6 is a schematic diagram of the determining unit 123 according to some embodiments of the present disclosure. The determining unit 123 includes a NAND gate NG3, a NAND gate NG4, an inverter INV3, and an inverter INV4. As illustrated in FIG. 6, a first input port of the NAND gate NG3 is configured to receive the signal S1, a second input port of the NAND gate NG3 is coupled to an output of the inverter INV3, an output port of the NAND gate NG3 is coupled to a second input port of the NAND gate NG4, an input port of the inverter INV3 is configured to receive the input signal IN4, a first input port of the NAND gate NG4 is configured to receive the signal S2, an output port of the NAND gate NG4 is coupled to an input port of the inverter INV4, and an output port of the inverter INV4 is configured to output the output signal OUT2.

Figure 7:
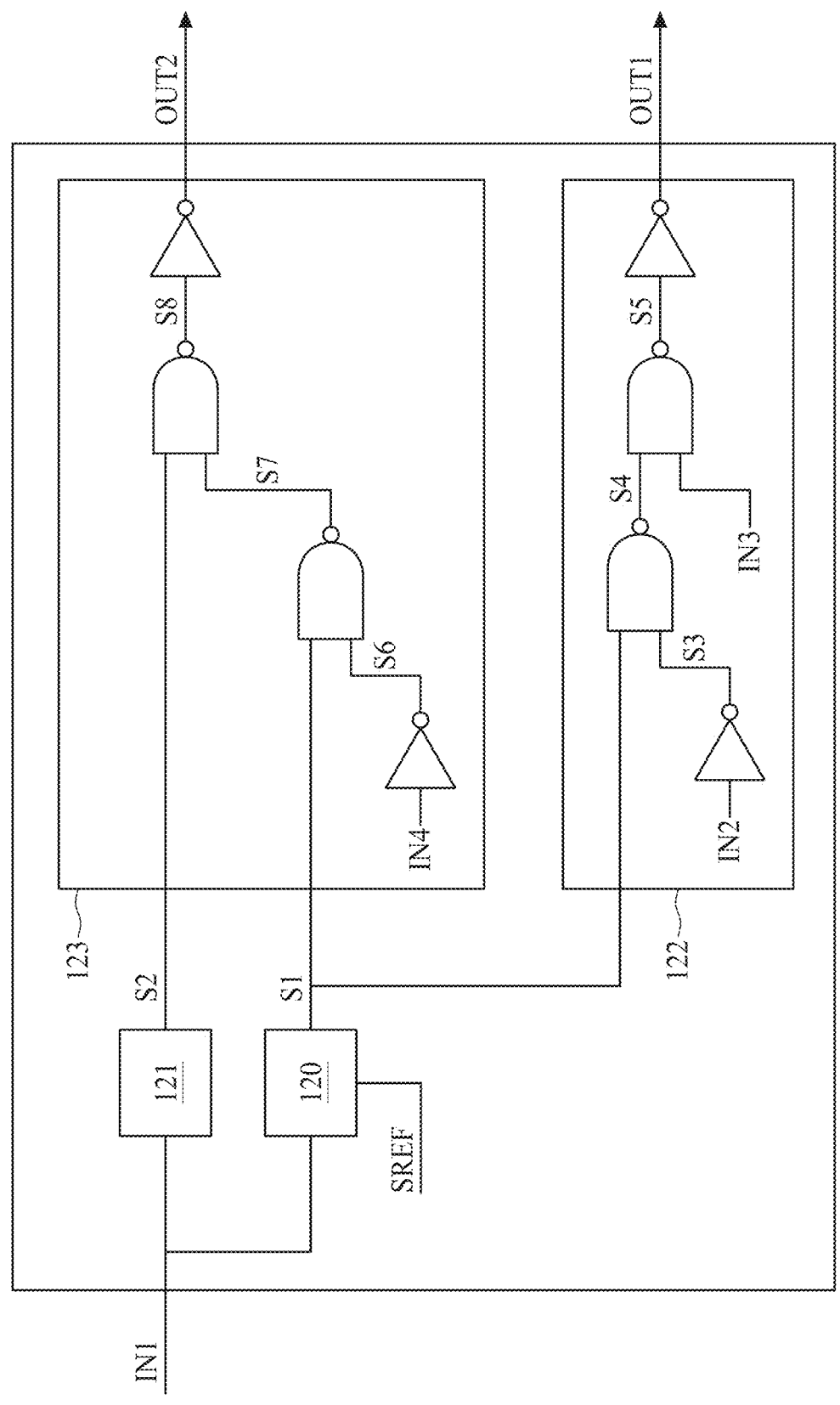
FIG. 7 is schematic diagram of the determining circuit according to some embodiments of the present disclosure.

Reference is made to FIG. 7. FIG. 7 is schematic diagram of the determining circuit 12 according to some embodiments of the present disclosure. In FIG. 7, signals S1, S2, S3, S4, S5, S6, S7, and S8 are illustrated for the ease of discussion.

In some embodiments, the signals S1, S2, S3, S4, S5, S6, S7, and S8 are digital signals, and have the logic high level or the logic low level. In other words, the level of signals S1, S2, S3, S4, S5, S6, S7, and S8 can only be 0 or 1.

The description of signal S1 and the signal S2 are the same as of those discussed with reference of FIG. 3 above. As illustrated in FIG. 7, in the determining unit 122, the signal S3 is inverted from the input signal IN2, the signal S4 is result of performing NAND operation on the signal S1 and the signal S3, the signal S5 is the result of performing NAND operation on the signal S4 and the input signal IN3, and the output signal OUT1 is inverted from the signal S5.

In the determining unit 123, the signal S6 is inverted from the input signal IN4, the signal S7 is the result of performing NAND operation on the signal S1 and the signal S6, the signal S8 is the result of performing NAND operation on the signal S2 and the signal S7, and the output signal OUT2 is inverted from the signal S8.

Reference is made to FIG. 8, FIG. 9, FIG. 10, FIG. 11, FIG. 12, FIG. 13, FIG. 14, and FIG. 15. FIG. 8 to FIG. 15 are schematic diagrams of operations of the determining unit 122 according to some embodiments of the present disclosure. To facilitate understanding, the input signal IN2, the input signal IN3, the signals S1, S2, S3, S4, and S5 and the output signal OUT1 are denoted with the logic level 0 or 1.

Figure 8:
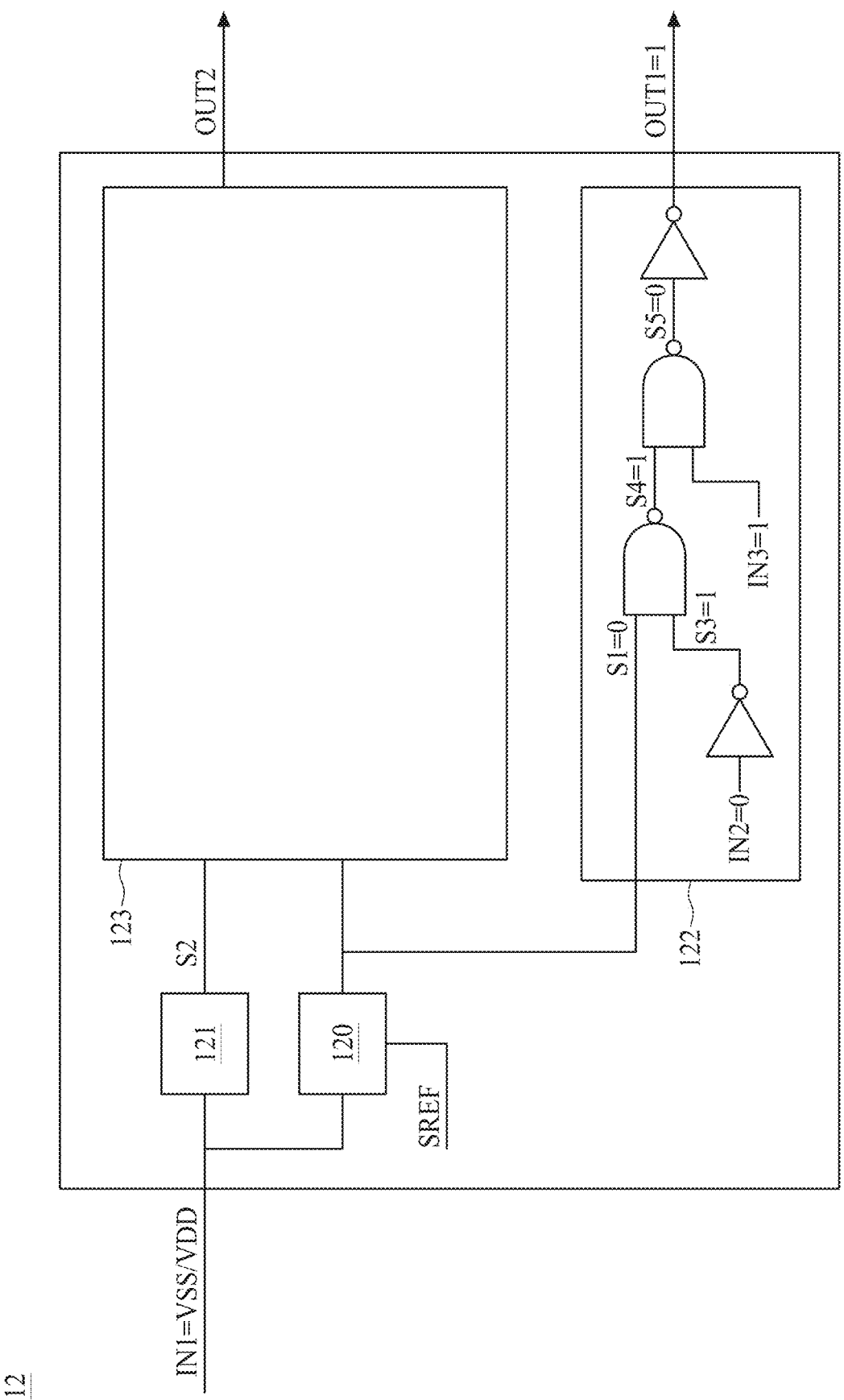
FIG. 8, FIG. 9, FIG. 10, FIG. 11, FIG. 12, FIG. 13, FIG. 14, and FIG. 15 are schematic diagrams of operations of the determining unit of the determining circuit of the connecting module of the DRAM according to some embodiments of the present disclosure.

In FIG. 8, the input signal IN1 has the voltage VSS or VDD, the input signal IN2 has the logic low level, and the input signal IN3 has the logic high level. Under this condition, the signal S1 has the logic low level, the signal S3 has the logic high level, the signal S4 has the logic high level, and the signal S5 has the logic low level. Therefore, the output signal OUT1 has the logic high level so as to make the DRAM 1 be operated under the second operation mode.

In some embodiments, the input signal IN2 and the input signal IN3 have a default level, in which the default level of input signal IN2 is the logic low level, and the default level of the input signal IN3 is the logic high level. In other words, when the input signals IN2 and IN3 are not being controlled, the input signals IN2 and IN3 intrinsically have the logic low and the logic high level, respectively.

Figure 9:
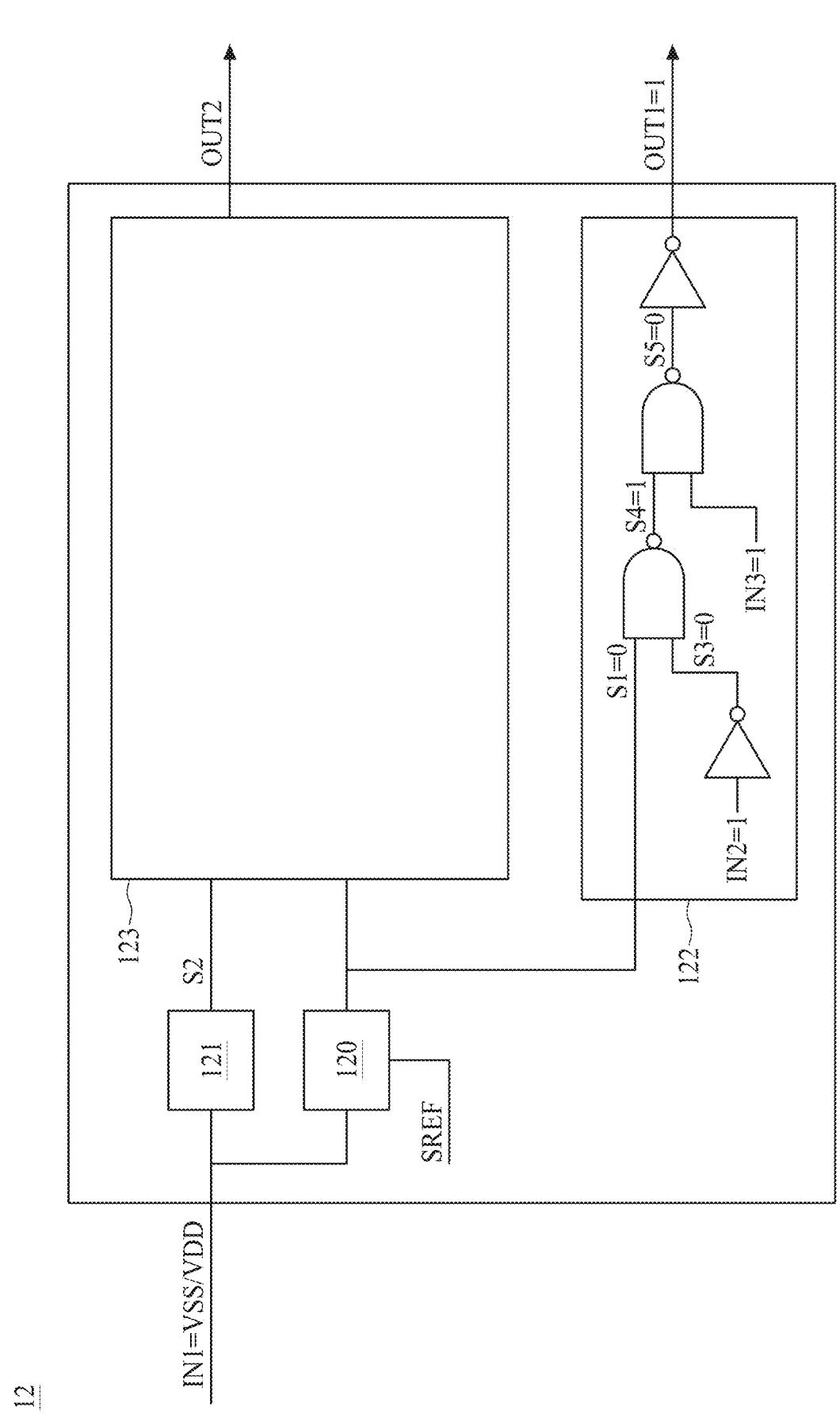

In FIG. 9, the input signal IN2 is controlled to have the logic high level. As shown in FIG. 9, the input signal IN1 still has the voltage VSS or VDD, and the input signal IN3 still has the logic high level. Under this condition, the signal S1 has the logic low level, the signal S3 has the logic low level, the signal S4 has the logic high level, and the signal S5 has the logic low level. Therefore, the output signal OUT1 has the logic high level so as to make the DRAM 1 be operated under the second operation mode.

Figure 10:
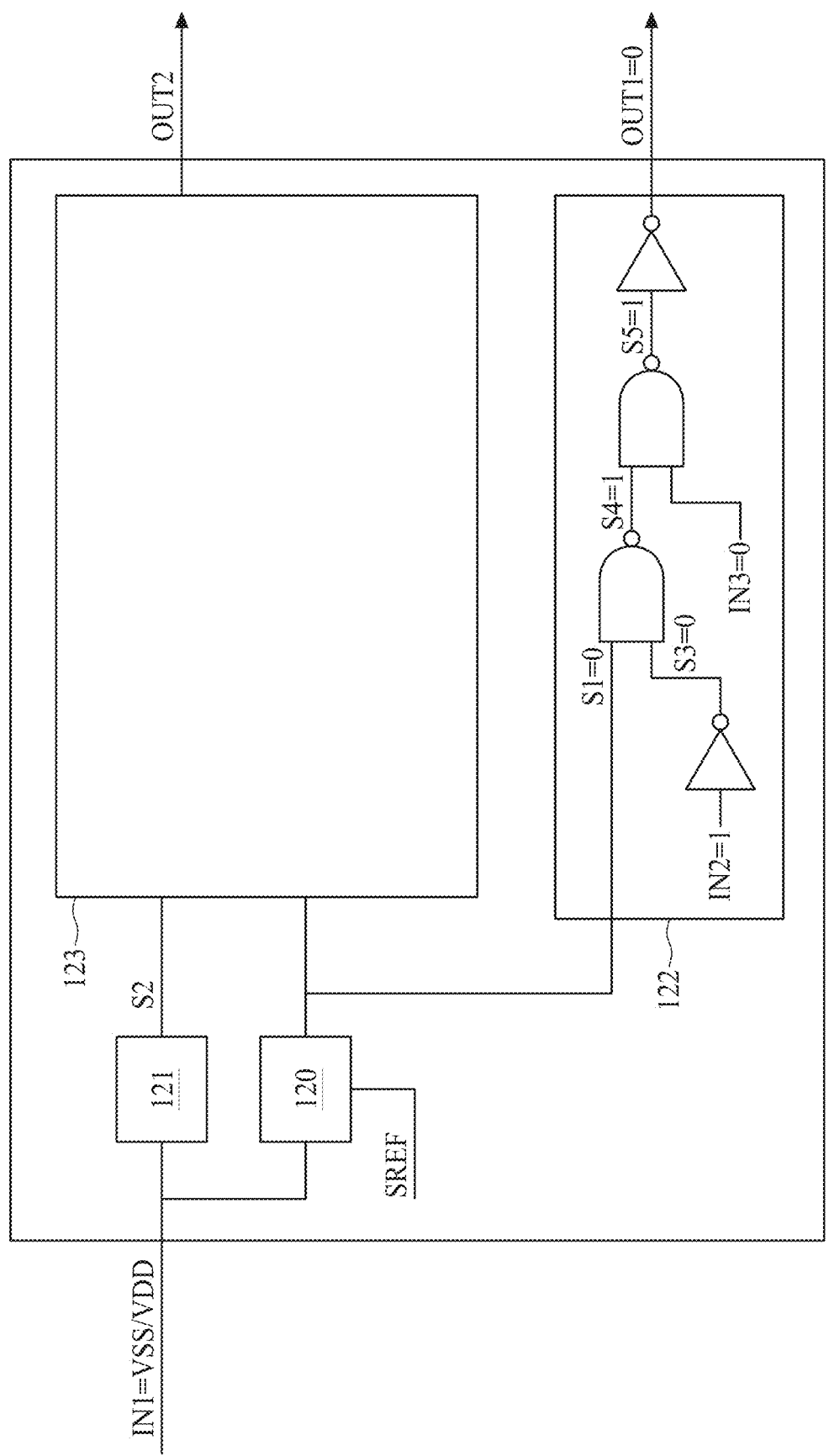

In FIG. 10, the input signal IN2 and the input signal IN3 are controlled to have the logic high level and the logic low level, respectively. As shown in FIG. 10, the input signal IN1 still gas the voltage VSS or VDD. Under this condition, the signal S1 has the logic low level, the signal S3 has the logic low level, the signal S4 has the logic high level, and the signal S5 has the logic high level. Therefore, the output signal OUT1 has the logic low level so as to make the DRAM 1 be operated under the first operation mode.

Figure 11:
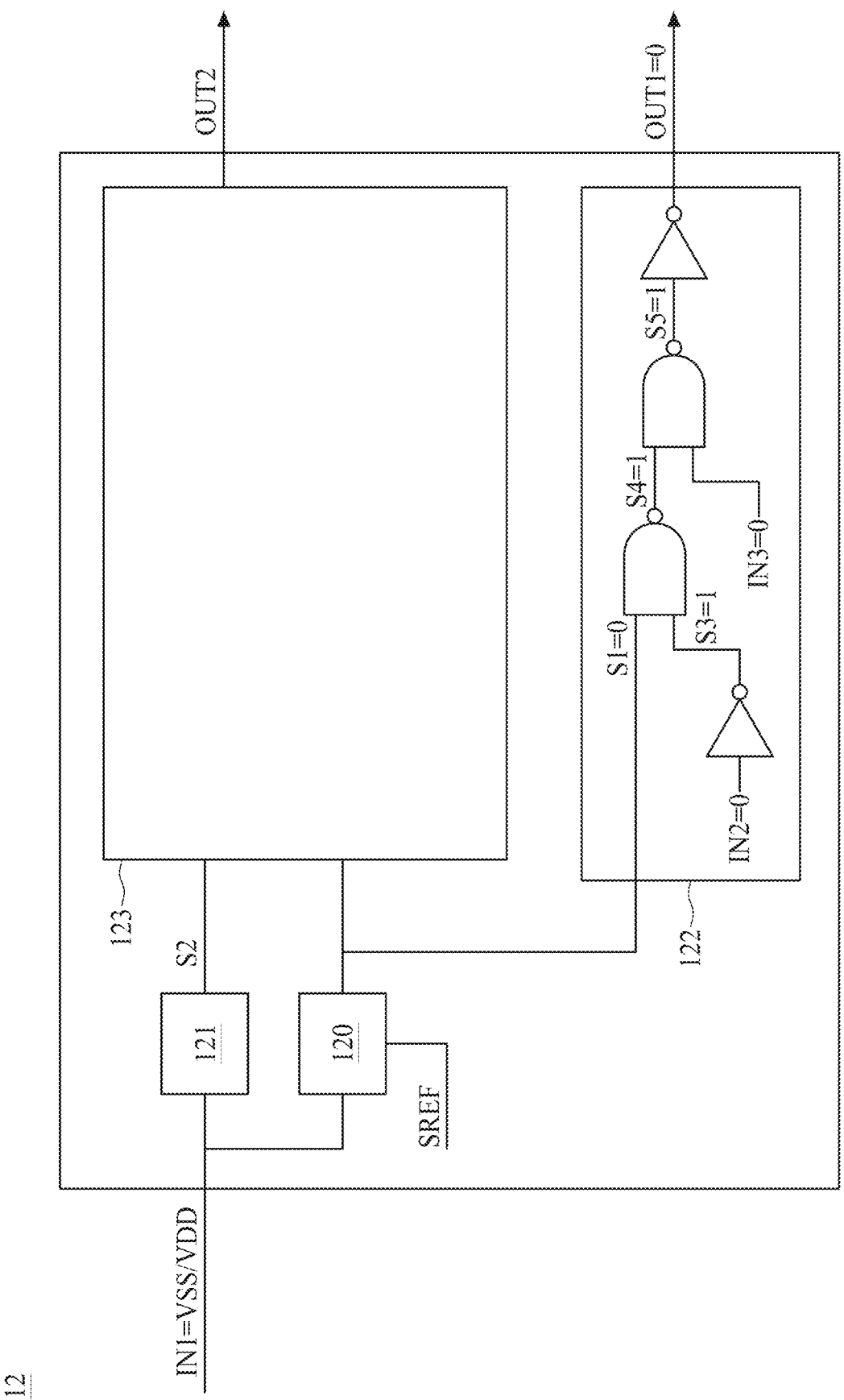

In FIG. 11, the input signal IN2 and the input signal IN3 are controlled to have the logic low level. As shown in FIG. 11, the input signal IN1 still gas the voltage VSS or VDD. Under this condition, the signal S1 has the logic low level, the signal S3 has the logic high level, the signal S4 has the logic high level, and the signal S5 has the logic high level. Therefore, the output signal OUT1 has the logic low level so as to make the DRAM 1 be operated under the first operation mode.

Figure 12:
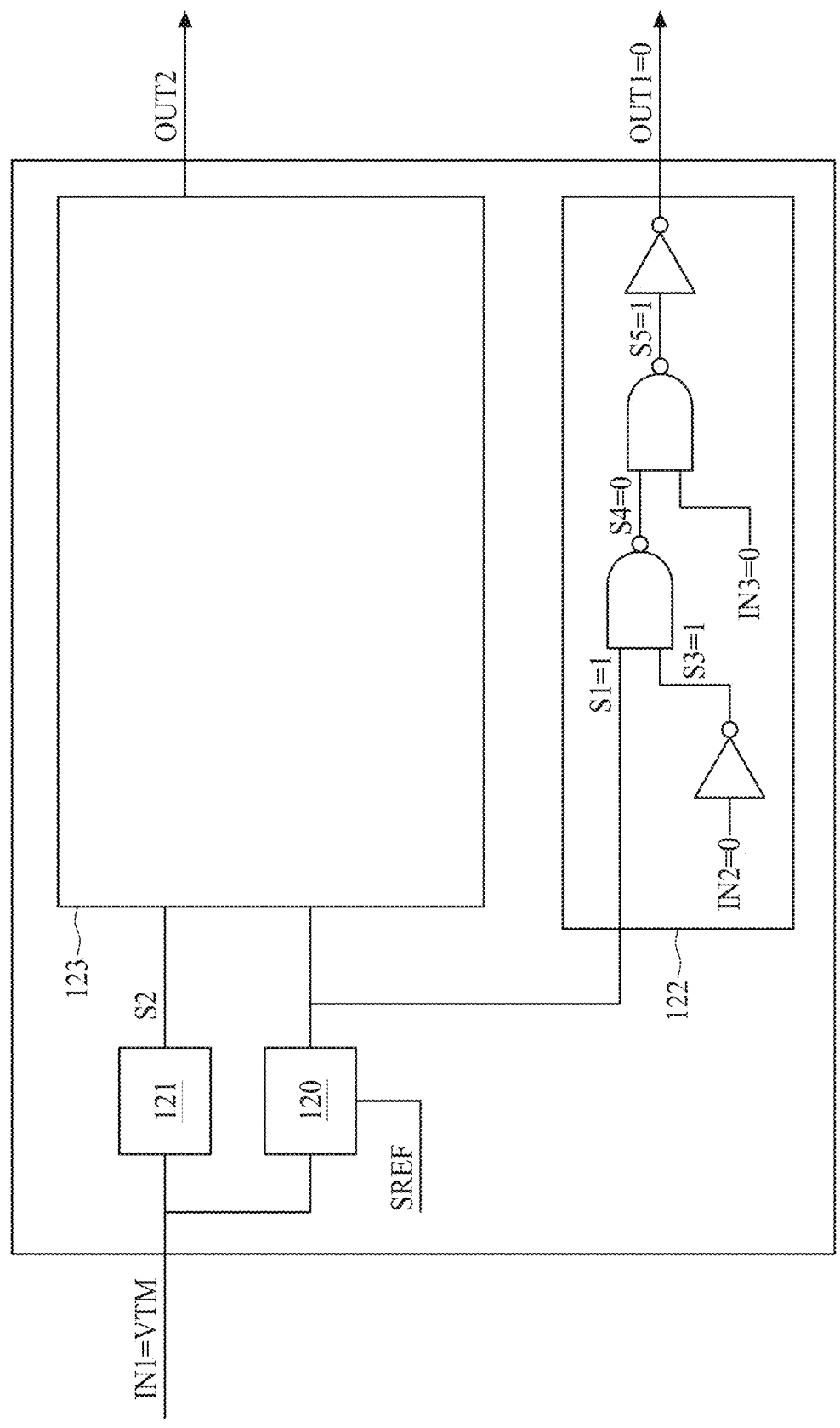

In FIG. 12, the input signal IN1 has the voltage VTM, the input signal IN2 and the input signal IN3 have the logic low level. Under this condition, the signal S1 has the logic high level, the signal S3 has the logic high level, the signal S4 has the logic low level, and the signal S5 has the logic high level. Therefore, the output signal OUT1 has the logic low level so as to make the DRAM 1 be operated under the first operation mode.

Figure 13:
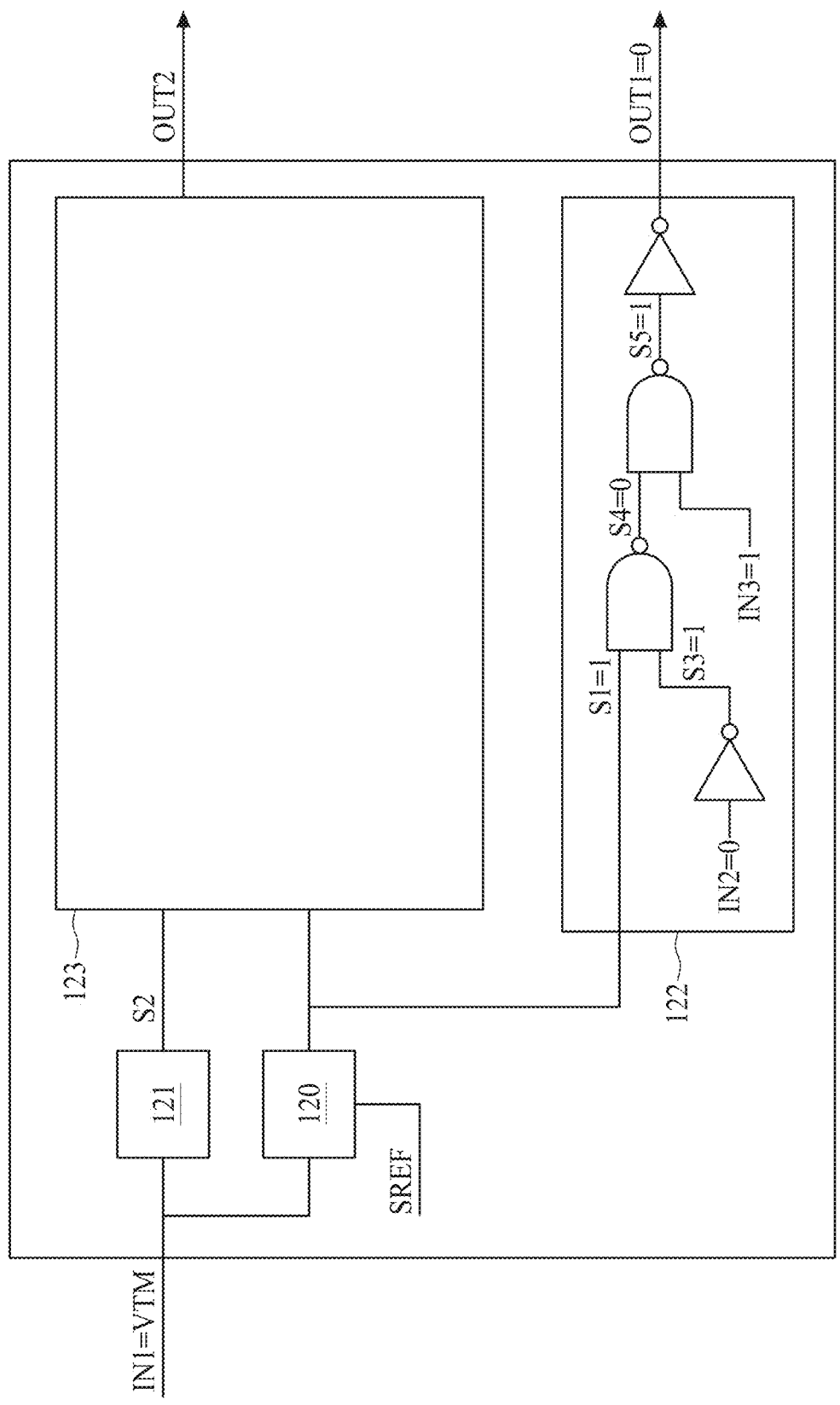

In FIG. 13, the input signal IN3 is controlled to have the logic high level. As shown in FIG. 13, the input signal IN1 still has the voltage VTM, and the input signal IN2 still has the logic low level. Under this condition, the signal S1 has the logic high level, the signal S3 has the logic high level, the signal S4 has the logic low level, and the signal S5 has the logic high level. Therefore, the output signal OUT1 has the logic low level so as to make the DRAM 1 be operated under the first operation mode.

Figure 14:
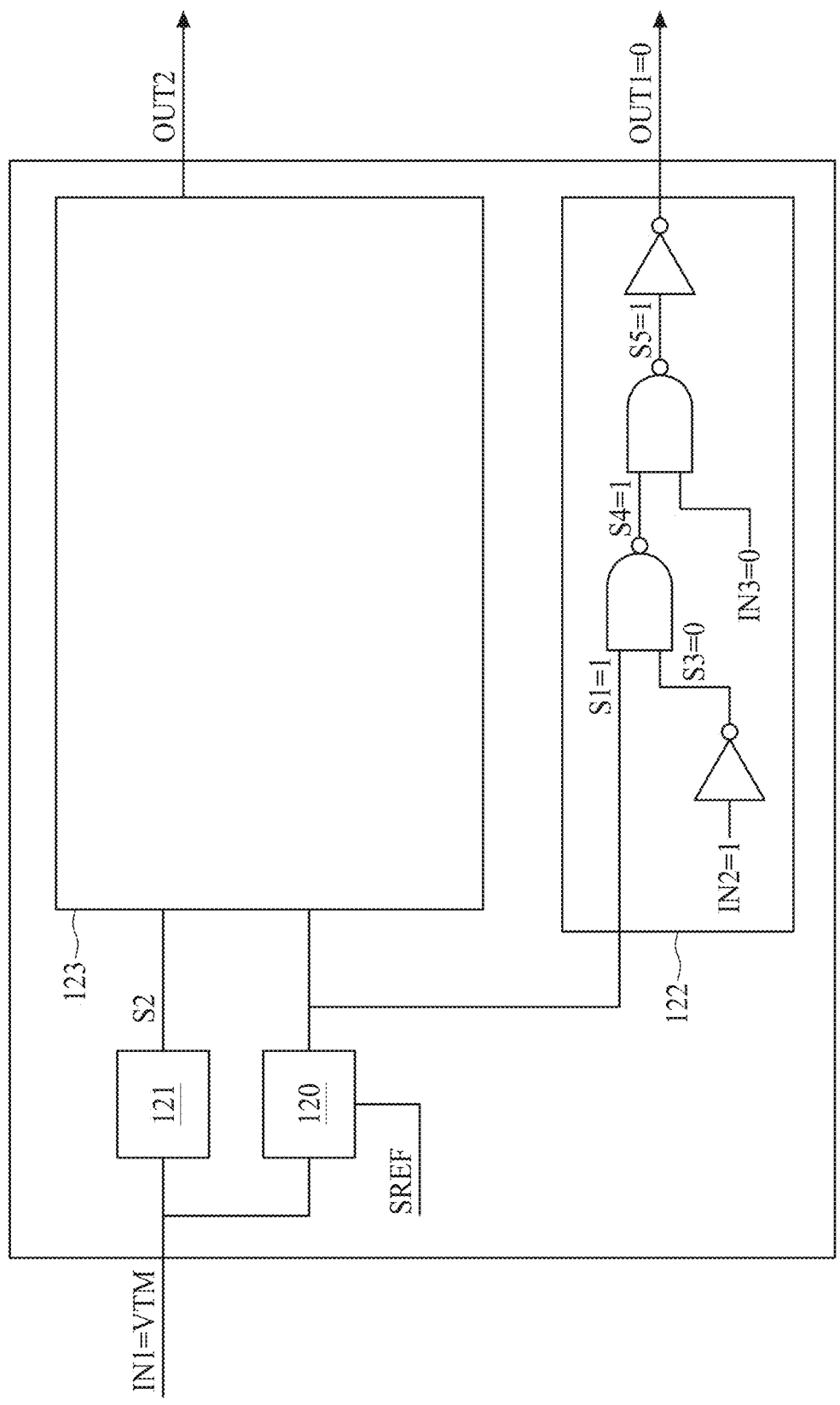

In FIG. 14, the input signal IN2 and the input signal IN3 are controlled to have the logic high level and the logic low level, respectively. As shown in FIG. 14, the input signal IN1 still has the voltage VTM. Under this condition, the signal S1 has the logic high level, the signal S3 has the logic low level, the signal S4 has the logic high level, and the signal S5 has the logic high level. Therefore, the output signal OUT1 has the logic low level so as to make the DRAM 1 be operated under the first operation mode.

Figure 15:
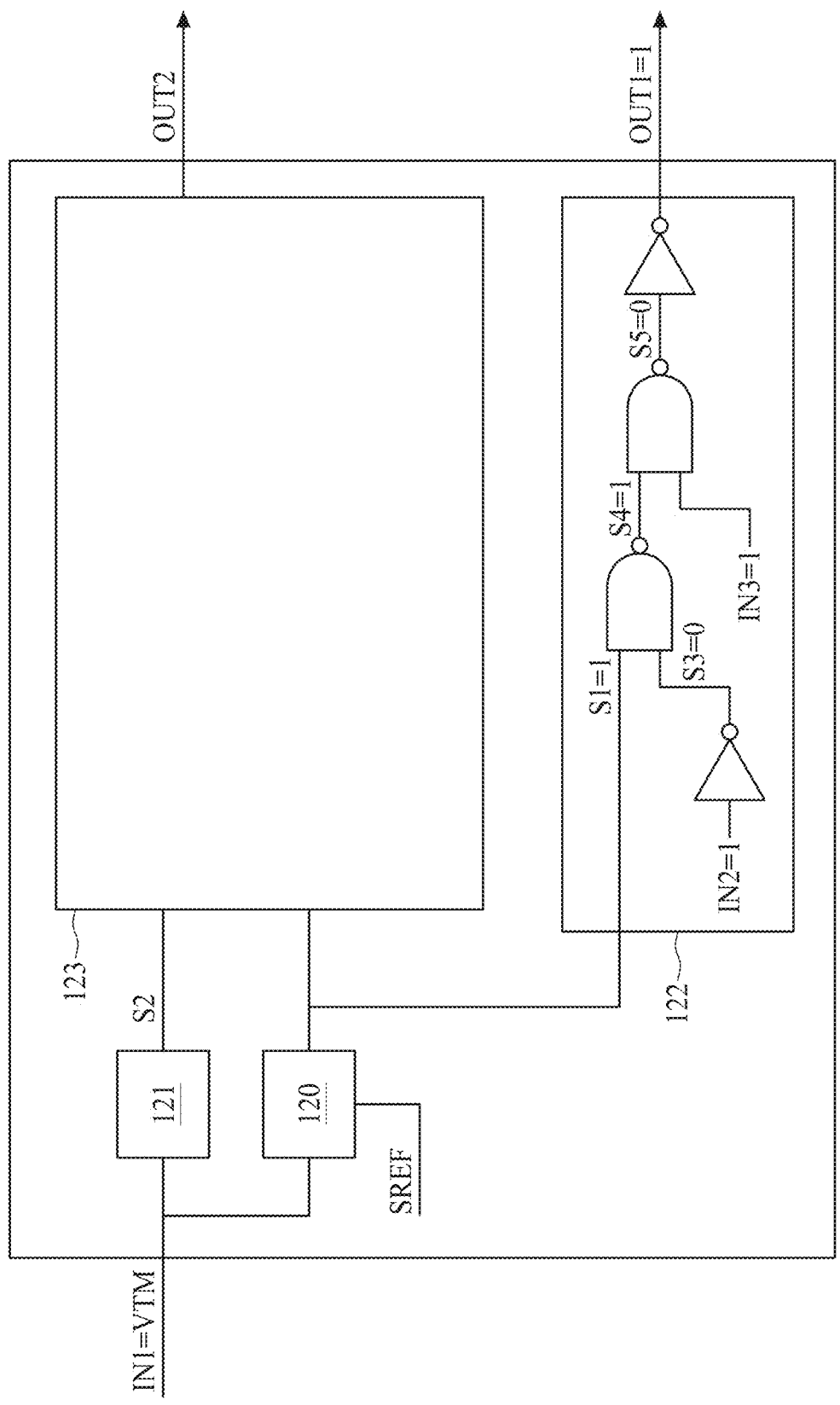

In FIG. 15, the input signal IN2 and the input signal IN3 are controlled to have the logic high level. As shown in FIG. 15, the input signal IN1 still has the voltage VTM. Under this condition, the signal S1 has the logic high level, the signal S3 has the logic low level, the signal S4 has the logic high level, and the signal S5 has the logic low level. Therefore, the output signal OUT1 has the logic high level so as to make the DRAM 1 be operated under the second operation mode.

According to the results of FIG. 8 to FIG. 15, the results of logic operations of the determining unit 122 can be summarized as an operating chart OC1 as shown in FIG. 16.

Reference is made to FIG. 17, FIG. 18, FIG. 19, FIG. 20, FIG. 21, and FIG. 22. FIG. 17 to FIG. 22 are schematic diagrams of operations of determining unit 123 according to some embodiments of the present disclosure. To facilitate understanding, the input signal IN4, the signals S6, S7, and S8 and the output signal OUT2 are denoted with the logic level 0 or 1.

Figure 17:
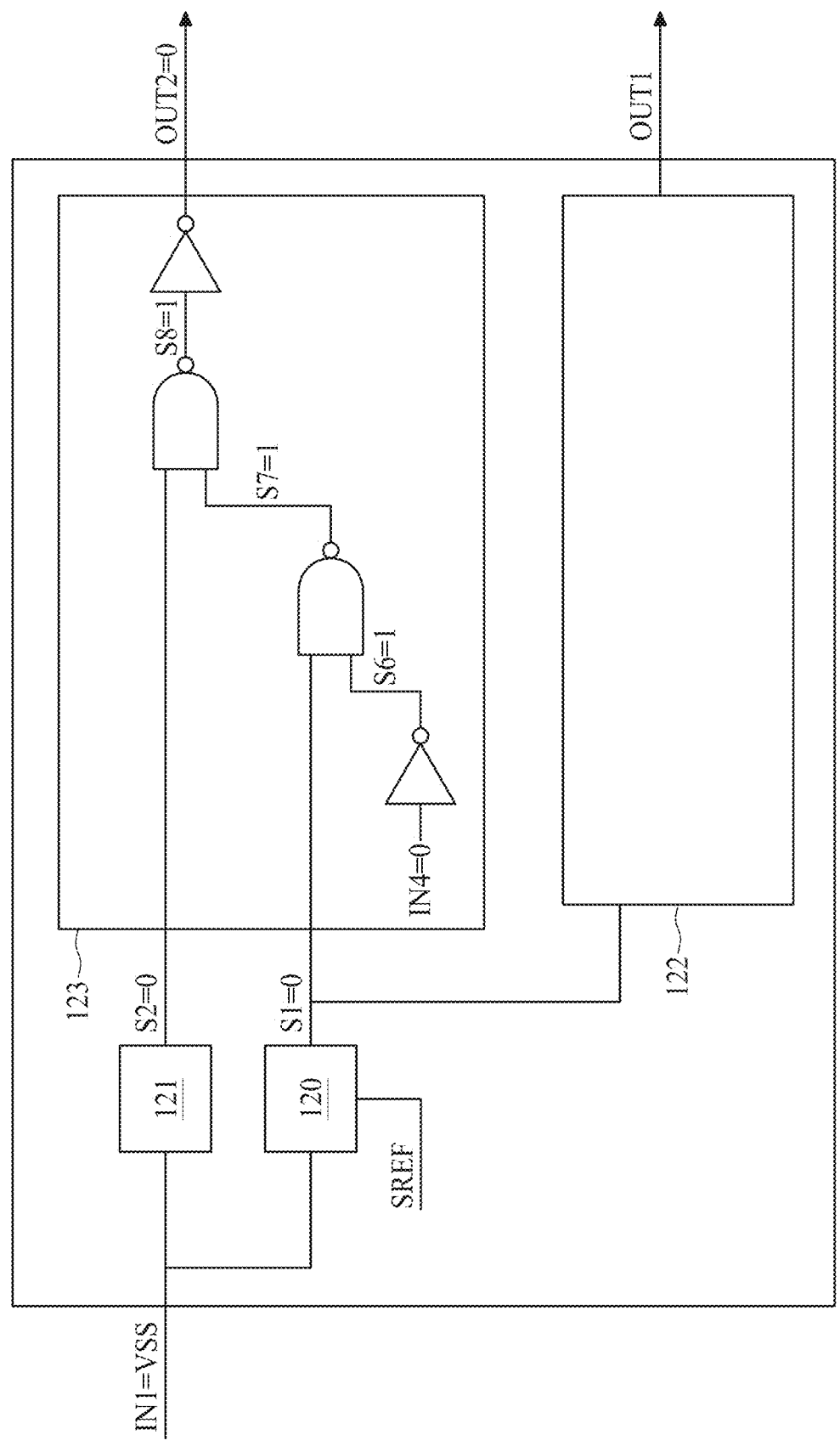
FIG. 17, FIG. 18, FIG. 19, FIG. 20, FIG. 21, and FIG. 22 are schematic diagrams of operations of the determining unit of the determining circuit of the connecting module of the DRAM according to some embodiments of the present disclosure.

In FIG. 17, the input signal IN1 has the voltage VSS and the input signal IN4 has the logic low level. Under this condition, the signal S1 and the signal S2 have the logic low level, the signal S6 has the logic high level, the signal S7 has the logic high level, and the signal S8 has the logic high level. Therefore, the output signal OUT2 has the logic low level so as to make the connecting module 10 not be subjected to the connectivity test.

In some embodiments, the input signal IN4 has a default level, in which the default level of input signal IN4 is the logic low level. In other words, when the input signal IN4 is not being controlled, the input signal IN4 intrinsically has the logic low level.

Figure 18:
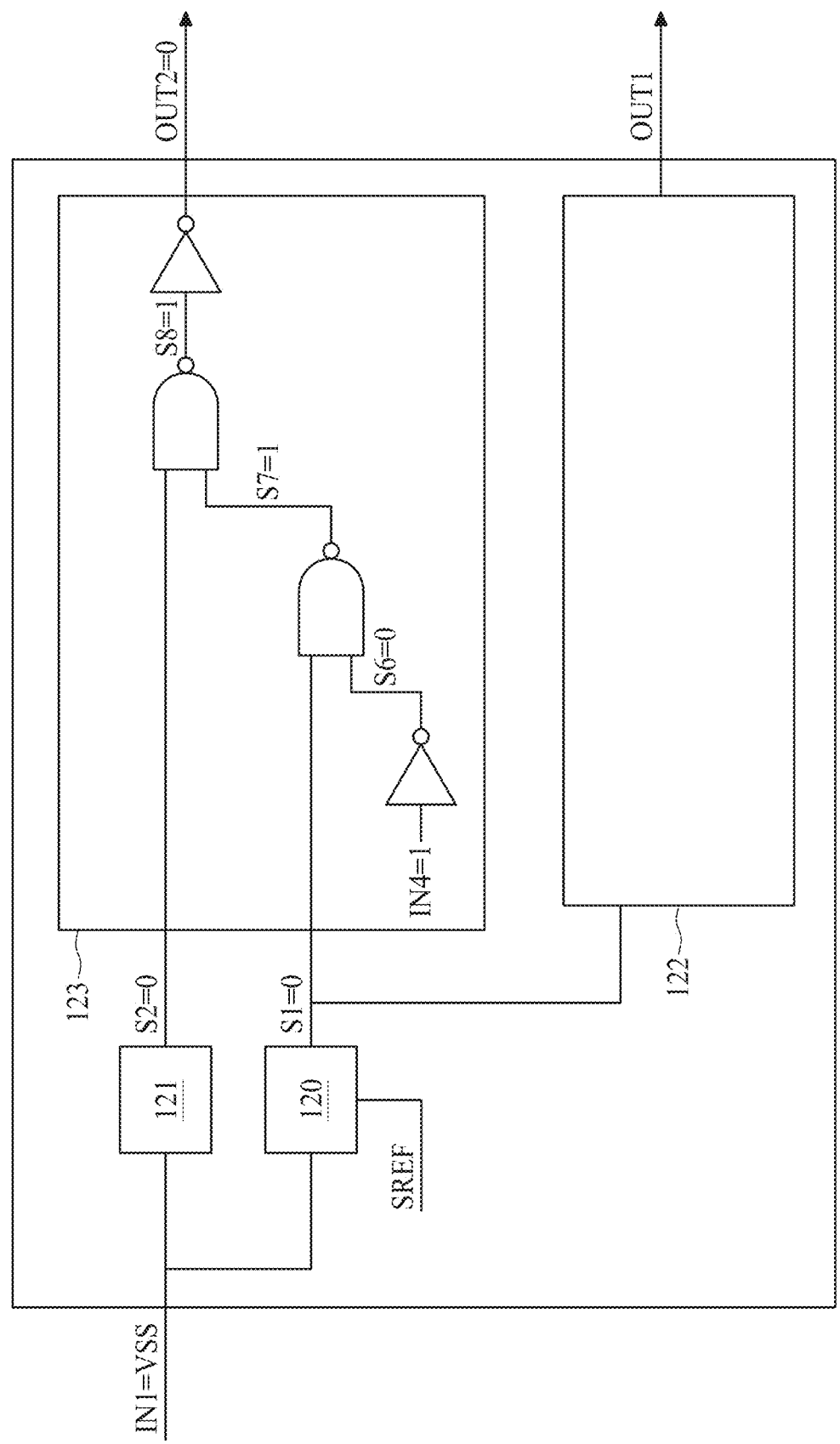

In FIG. 18, the input signal IN4 is controlled to have the logic high level. As shown in FIG. 18, the input signal IN1 still has the voltage VSS. Under this condition, the signal S1 and the signal S2 have the logic low level, the signal S6 has the logic low level, the signal S7 has the logic high level, and the signal S8 has the logic high level. Therefore, the output signal OUT2 has the logic low level so as to make the connecting module 10 not be subjected to the connectivity test.

Figure 19:
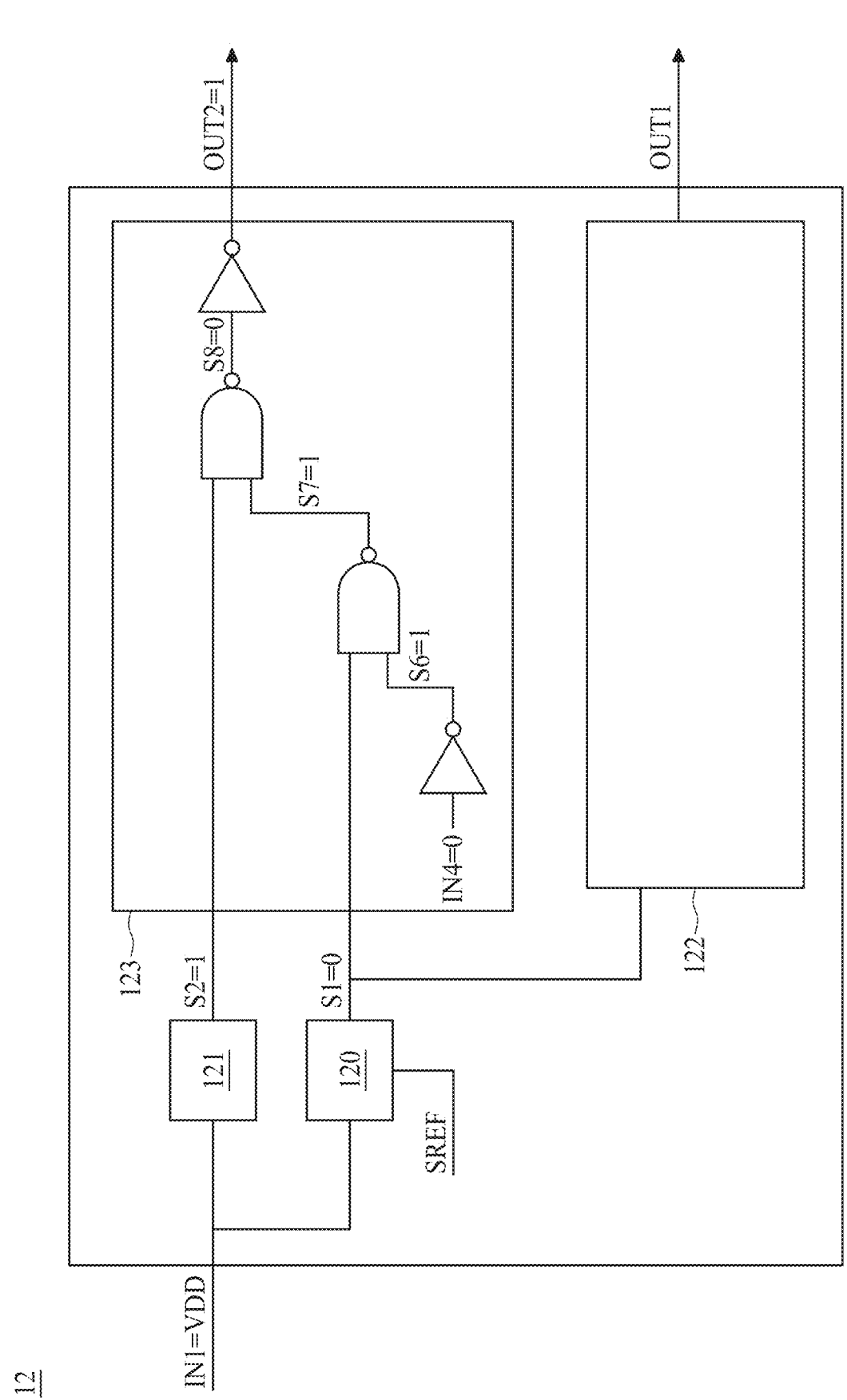

In FIG. 19, input signal IN1 has the voltage VDD, and the input signal IN4 has the logic low level. Under this condition, the signal S1 has the logic low level, the signal S2 has the logic high level, the signal S6 has the logic high level, the signal S7 has the logic high level, and the signal S8 has the logic low level. Therefore, the output signal OUT2 has the logic high level so as to make the connecting module 10 be subjected to the connectivity test.

Figure 20:
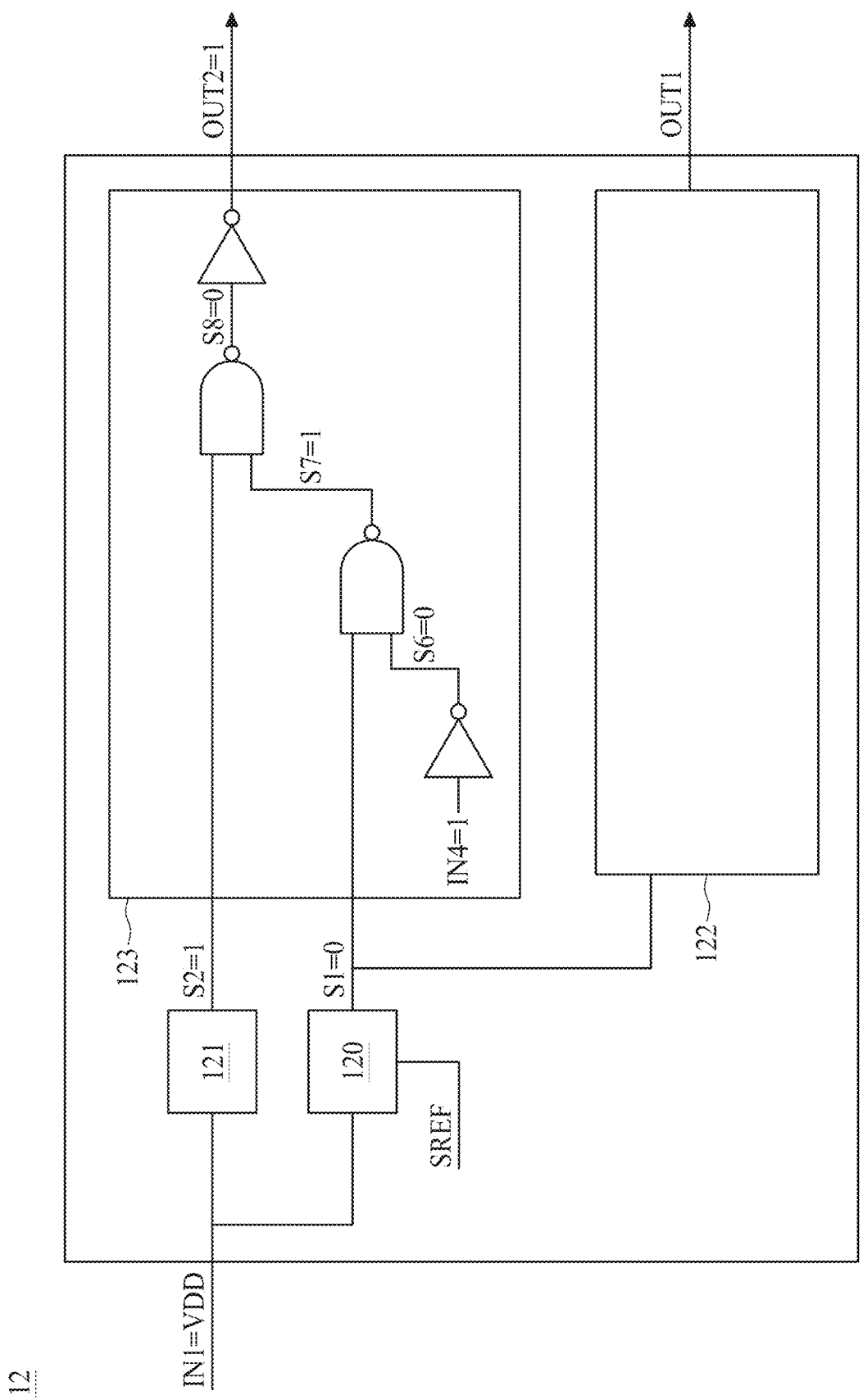

In FIG. 20, input signal IN1 has the voltage VDD, and the input signal IN4 has the logic high level. Under this condition, the signal S1 has the logic low level, the signal S2 has the logic high level, the signal S6 has the logic low level, the signal S7 has the logic high level, and the signal S8 has the logic low level. Therefore, the output signal OUT2 has the logic high level so as to make the connecting module 10 be subjected to the connectivity test.

Figure 21:
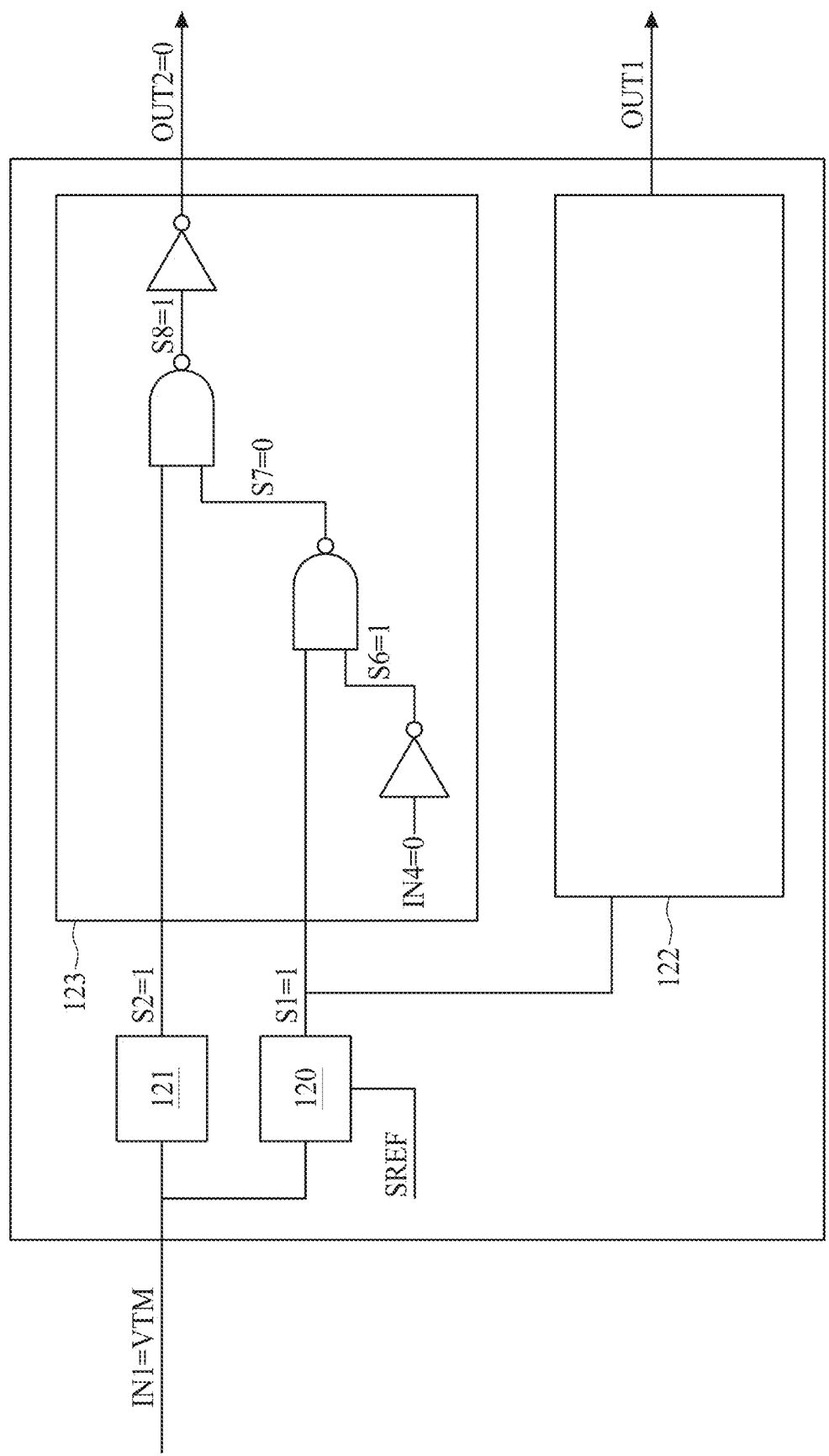

In FIG. 21, input signal IN1 has the voltage VTM, and the input signal IN4 has the logic low level. Under this condition, the signal S1 and the signal S2 has the logic high level, the signal S6 has the logic high level, the signal S7 has the logic low level, and the signal S8 has the logic high level.

Therefore, the output signal OUT2 has the logic low level so as to make the connecting module 10 not be subjected to the connectivity test.

Figure 22:
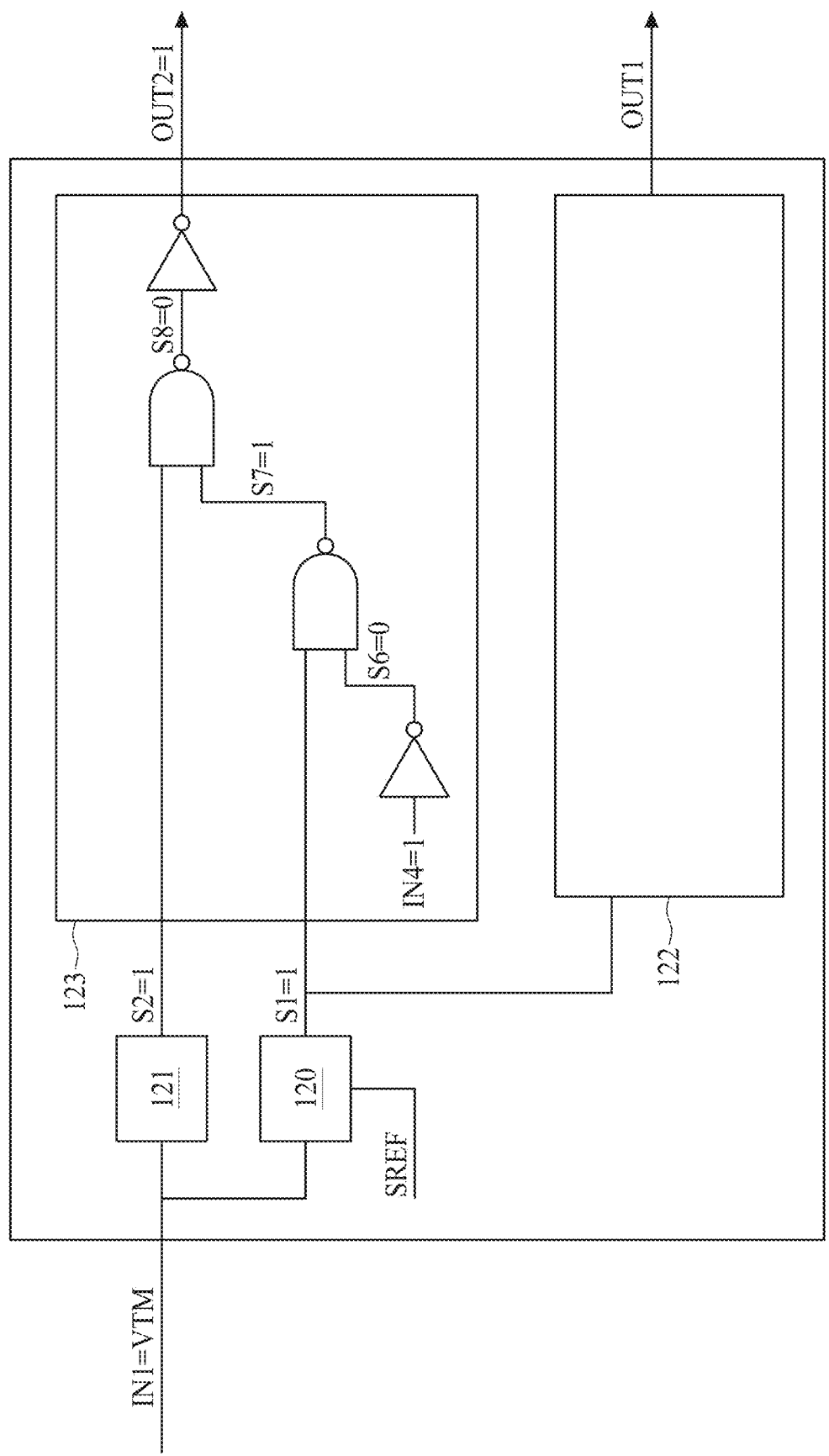

In FIG. 22, input signal IN1 has the voltage VTM, and the input signal IN4 has the logic high level. Under this condition, the signal S1 and the signal S2 has the logic high level, the signal S6 has the logic low level, the signal S7 has the logic high level, and the signal S8 has the logic low level. Therefore, the output signal OUT2 has the logic high level so as to make the connecting module 10 be subjected to the connectivity test.

According to the results of FIG. 17 to FIG. 22, the results of logic operations of the determining unit 123 can be summarized as an operating chart OC2 as shown in FIG. 23.

Reference is made to FIG. 24, FIG. 25, FIG. 26, FIG. 27, FIG. 28, and FIG. 29. FIG. 24 to FIG. 29 are flowchart diagrams of a method 24 for controlling the DRAM 1 according to some embodiments of the present disclosure. The method 24 is performed to switch the operation modes of the DRAM 1. Specifically, when the DRAM 1 is tested, the operation modes of the DRAM 1 can be changed by performing the method 24 in order to have a better testing efficiency. For example, when a DDR5 SDRAM is subjected to a functional test, the default 2N mode of the DDR5 SDRAM is changed to the 1N mode by performing the method 24. Therefore, the DDR5 SDRAM can be operated under the 1N mode to have a better testing efficiency. Detailed operations of method 24 are described below and with references of FIG. 1 to FIG. 23.

Figure 24:
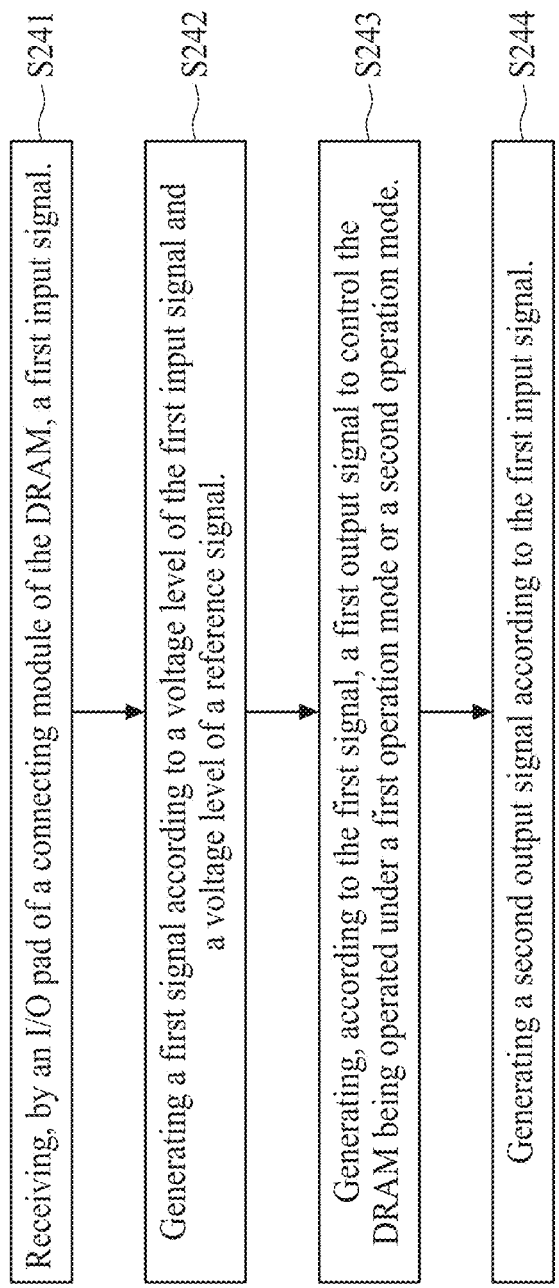
FIG. 24, FIG. 25, FIG. 26, FIG. 27, FIG. 28, and FIG. 29 are flowchart diagrams of a method for controlling the DRAM according to some embodiments of the present disclosure.

In FIG. 24, the method 24 includes operations S241, S242, S243, and S244. In operation S241, the input signal IN1 is received by the I/O pad 11 of the DRAM 1. The input signal IN1 is transmitted to the determining circuit 12, and the detector 120 and the receiver 121 of the determining circuit 12 receive the input signal IN1. In operation S242, the signal S1 is generated by the detector 120 according to the voltage level of the input signal IN1 and the voltage level of the reference signal SREF. In operation S243, the output signal OUT1 is generated by the determining unit 122 of the determining circuit 12 according to the signal S1, and the output signal OUT1 is generated to control the DRAM 1 being operated under the first operation mode or the second operation mode. In operation S244, the output signal OUT2 is generated by the determining unit 123 of the determining circuit 12 according to the first input signal IN1. In some embodiments, when the output signal OUT1 has the logic high level, the DRAM 1 is controlled to be operated under the second operation mode. When the output signal OUT1 has the logic low level, the DRAM 1 is controlled to be operated under the first operation mode. In some embodiments, when the output signal OUT2 has the logic high level, the output signal OUT2 is generated to control the connecting module 10 of the DRAM 1 being subjected to the connectivity test.

Figure 25:
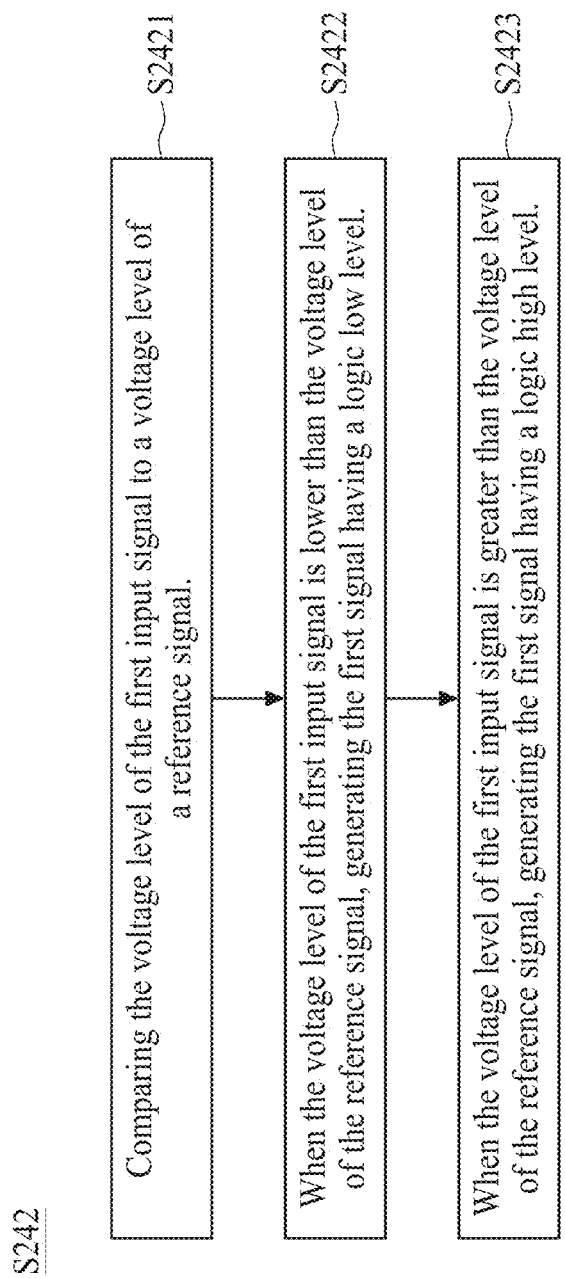

In some embodiments, the operation S242 includes operations S2421, S2422, and S2423 as shown in FIG. 25. In operation S2421, the voltage level of the input signal IN1 is compared to the voltage level of the reference signal SREF by the detector 120. In operation S2422, when the voltage level of the input signal IN1 is lower than the voltage level of the reference signal SREF, the signal S1 is generated to have the logic low level by the detector 120. In operation S2423, when the voltage level of the input signal IN1 is greater than the voltage level of the reference signal SREF, the signal S1 is generated to have the logic high level by the detector 120.

Figure 26:
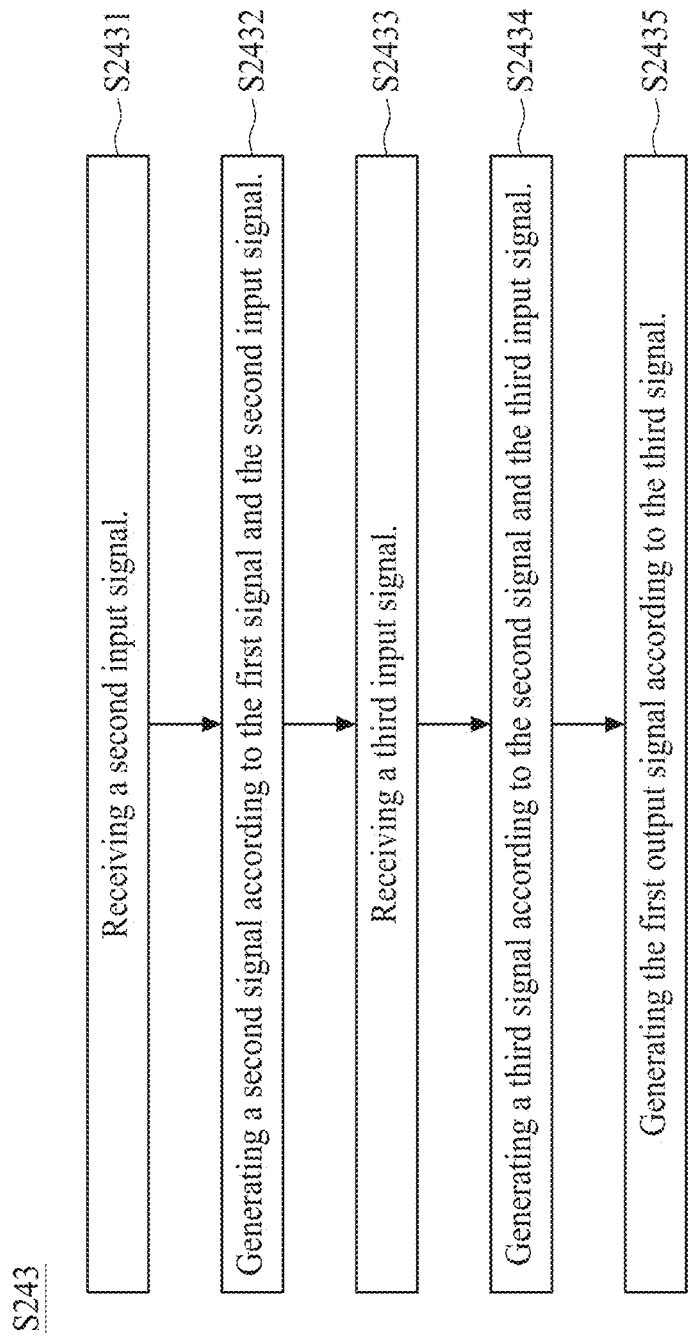

In some embodiments, the operation S243 includes operations S2431, S2432, S2433, S2434, and S2435 as shown in FIG. 26. In operation S2431, the input signal IN2 is received by the determining unit 122. In operation S2432, the signal S4 is generated according to the signal S1 and the input signal IN2. In operation S2433, the input signal IN3 is received by the determining unit 122. In operation S2434, the signal S5 is generated according to the signal S4 and the input signal IN3. In operation S2435, the output signal OUT1 is generated according to the signal S5. In some embodiments, when the signal S5 has the logic high level, the output signal OUT1 is generated to have the logic low level. In some embodiments, when the signal S1 having the logic high level, and the input signal IN2 and/or the input signal IN3 having the logic low level are achieved, the output signal OUT1 is generated to have the logic low level.

In some embodiments, the signal S3 is inverted from the input signal IN2. The signal S4 is generated by performing the NAND operation of the signal S1 and the signal S3. The signal S5 is generated by performing the NAND operation of the signal S4 and the input signal IN3. The output signal OUT1 is inverted from the signal S5.

Figure 27:
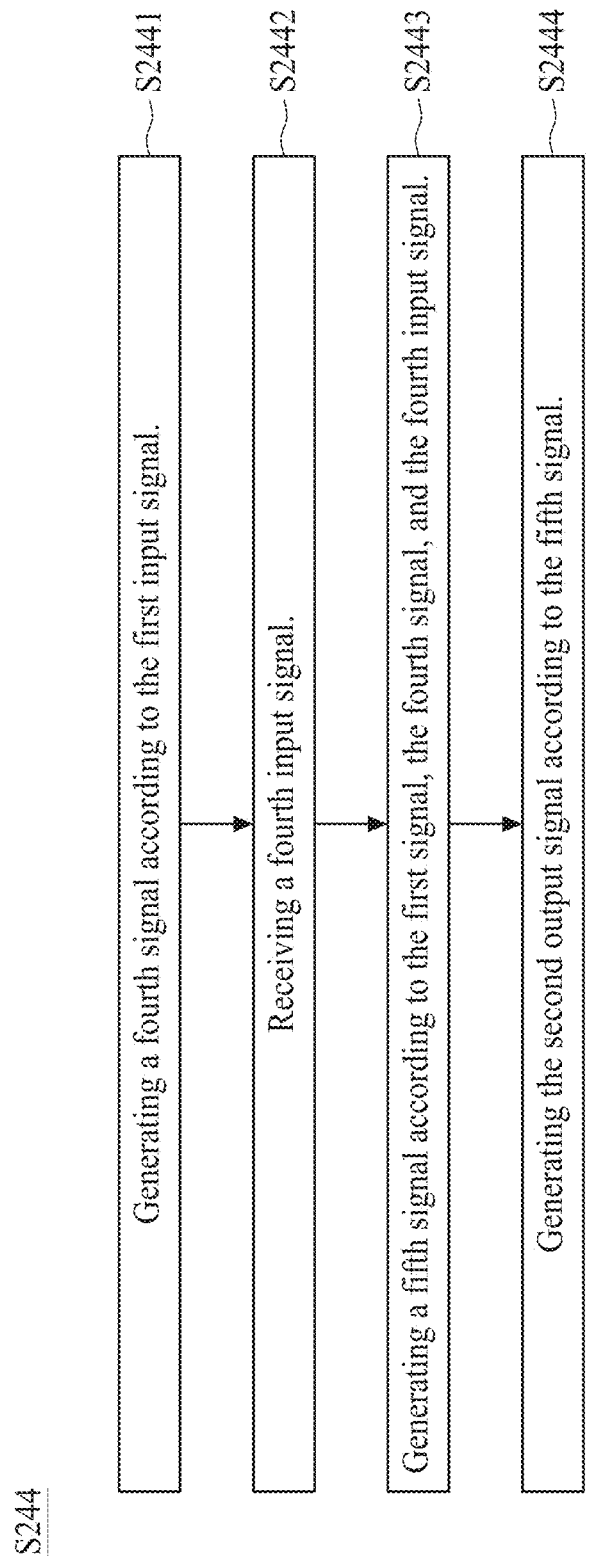

In some embodiments, the operation S244 includes operations S2441, S2442, S2443, and S2444 as shown in FIG. 27. In operation S2441, the signal S2 is generated according to the input signal IN1. In operation S2442, the input signal IN4 is received by the determining unit 123. In operation S2443, the signal S8 is generated according to the signal S1, the signal S2, and the input signal IN4. In operation S2444, the output signal OUT2 is generated according to the signal S8.

In some embodiments, the signal S6 is inverted from the input signal IN4. The signal S7 is generated by performing the NAND operation of the signal S1 and the signal S6. The signal S8 is generated by performing the NAND operation of the signal S2 and the signal S7. The output signal OUT2 is inverted from the signal S8.

Figure 28:
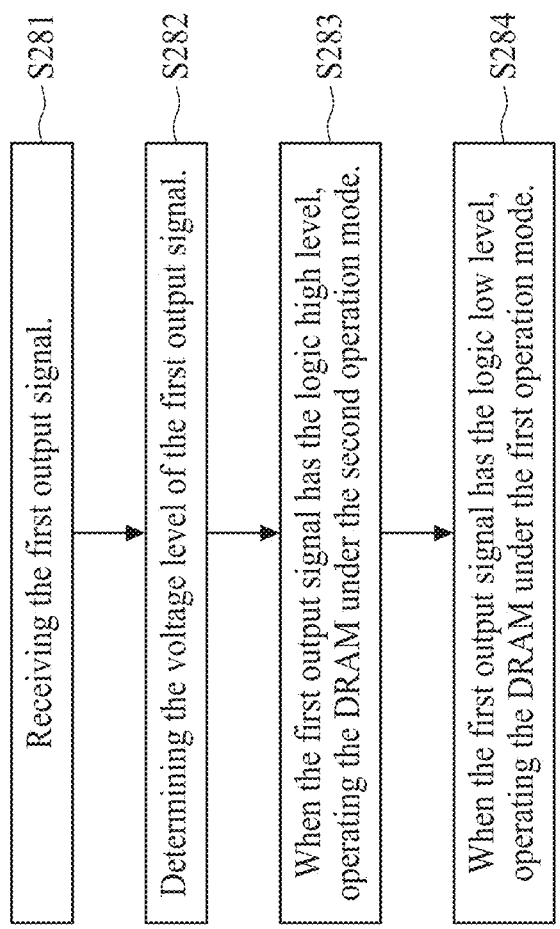

In some embodiments, the method 24 further includes the operations S281, S282, S283, and S284 as shown in FIG. 28. In operation S281, the output signal OUT1 is received by the control module 30. In operation S282, the voltage level of the output signal OUT1 is determined. In operation S283, when the output signal OUT1 has the logic high level, the DRAM 1 is controlled to be operated under the second operation mode. In some embodiments, the second operation mode can be the 2N mode of the DDR5 SDRAM. In operation S284, when the output signal OUT1 has the logic low level, the DRAM 1 is controlled to be operated under the first operation mode. In some embodiments, the first operation mode can be the 1N mode of the DDR5 SDRAM.

Figure 29:
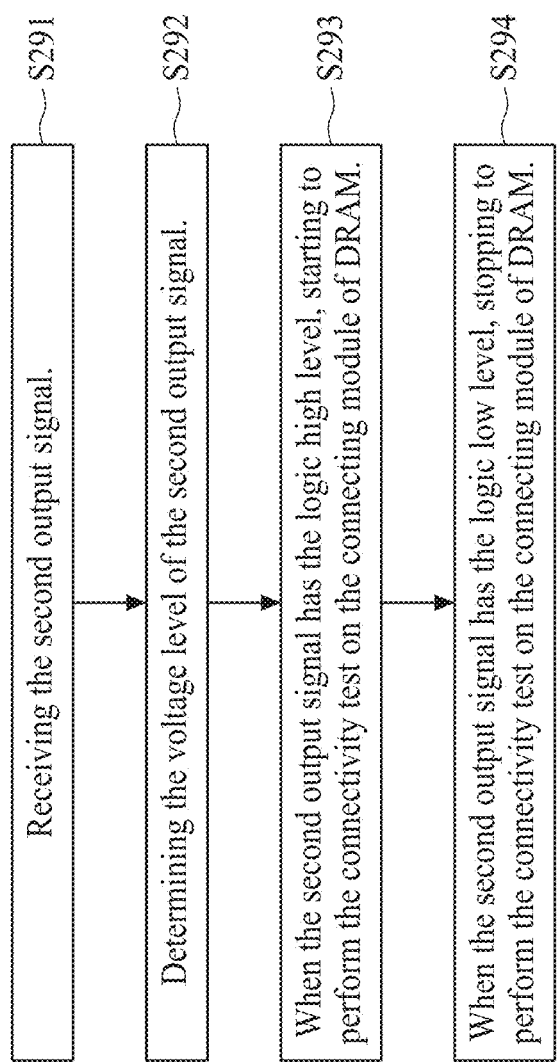

In some embodiments, the method 24 further includes the operations S291, S292, S293, and S294 as shown in FIG. 29. In operation S291, the output signal OUT2 is received by the control module 30. In operation S292, the voltage level of the output signal OUT2 is determined. In operation S293, when the output signal OUT2 has the logic high level, the connectivity test is performed on the connecting module 10 of the DRAM 1. In operation S294, when the output signal OUT2 has the logic low level, the connectivity test is stopped being performed.

One aspect of the present disclosure provides a dynamic random access memory (DRAM) having a first operation mode and a second operation mode, including a control module and a connecting module. The connecting module includes an input/output (I/O) pad and a determining circuit. The I/O pad is configured to receive a first input signal. The determining circuit includes a detector and a first determining unit. The detector is configured to compare the first input signal to a reference signal SREF so as to generate a first signal. The first determining unit is configured to receive the first signal and generate a first output signal according to the first signal. The control module is configured to control the DRAM being operated under the first operation mode or the second operation mode according to the first output signal.

Another aspect of the present disclosure provides a method for controlling the DRAM. The method includes: receiving, by an I/O pad of a connecting module of the DRAM, a first input signal; generating a first signal according to a voltage level of the first input signal and a voltage level of a reference signal SREF; and generating, according to the first signal, a first output signal to control the DRAM being operated under a first operation mode or a second operation mode. When the first output signal having a first logic level, the DRAM is controlled to be operated under the second operation mode, and when the first output signal having a second logic level, the DRAM is controlled to be operated under the first operation mode.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A dynamic random access memory (DRAM), having a first operation mode and a second operation mode, comprising:
   a control module; and
   a connecting module, comprising an input/output (I/O) pad and a determining circuit, wherein the I/O pad is configured to receive a first input signal, and the determining circuit comprises:
   a detector configured to compare the first input signal to a reference signal so as to generate a first signal; and
   a first determining unit circuit configured to receive the first signal and generate a first output signal according to the first signal,
   wherein the control module is configured to control the DRAM being operated under the first operation mode or the second operation mode according to the first output signal.

2. The DRAM of claim 1, wherein when the first output signal has a first logic level, the control module controls the memory array being operated under the first operation mode, and when the first output signal has a second logic level, the control module controls the DRAM being operated under the second operation mode.

3. The DRAM of claim 1, wherein when a voltage level of the first input signal is lower than a voltage level of the reference signal, the detector generates the first signal having a first logic level, and when the voltage level of the first input signal is higher than the voltage level of the reference signal, the detector generates the first signal having a second logic level.

4. The DRAM of claim 1, wherein the first determining unit circuit is further configured to receive a second input signal and generate the first output signal according to both of the first signal and the second input signal.

5. The DRAM of claim 4, wherein when the first signal has a second logic level and the second input signal has a first logic level, the first determining unit circuit generates the first output signal to make the DRAM be operated under the first operation mode.

6. The DRAM of claim 4, wherein the first determining unit circuit is further configured to receive a third input signal and generate the first output signal according to the first signal, the second input signal, and the third input signal.

7. The DRAM of claim 6, wherein when the first input signal has the second logic level and the third input signal has the first logic level, the first determining unit circuit generates the first output to make the DRAM be operated under the first operation mode.

8. The DRAM of claim 6, wherein when the first input signal, the second input signal, and the third input signal have the second logic level, the first determining unit circuit generates the first output signal to make the DRAM be operated under the second operation mode.

9. The DRAM of claim 6, wherein the first determining unit circuit comprises:
   a first NAND gate having a first input port, a second input port, and an output port;
   a second NAND gate having a first input port, a second input port, and an output port;
   a first inverter having an input port and an output port; and
   a second inverter having an input port and an output port,
   wherein the first input port of the first NAND gate is coupled to the detector and configured to receive the first signal, the second input port of the first NAND gate is coupled to the output port of the first inverter, the output port of the first NAND gate is coupled to the first input port of the second NAND gate, the input port of the first inverter is configured to receive the second input signal, the second input port of the second NAND gate is configured to receive the third input signal, the output port of the second NAND gate is coupled to the input port of the second inverter, and the output port of the second inverter is configured to output the first output signal.

10. The DRAM of claim 1, wherein the determining circuit further comprises:
    a receiver configured to receive the first input signal and generate a second signal according the first input signal; and
    a second determining unit circuit configured to receive the first signal and the second signal, and configured to generate a second output signal according to the first signal and the second signal,
    wherein the control module is configured to control the connecting module being tested according to the second output signal.

11. The DRAM claim 10, wherein when a voltage of the input signal is lower than a voltage of the reference signal, the receiver generates the second signal having a first logic level, and when the voltage of the input signal is substantial equal to the voltage level of the reference signal, the receiver generates the second signal having a second logic level.

12. The DRAM of claim 11, wherein the second determining unit circuit is further configured to receive a fourth input signal and generate the second output signal according to all of the first signal, second signal, and the fourth input signal, and
wherein
when the first signal and the second signal have the first logic level, the second determining unit circuit generates the second output signal to make the connecting module not be tested,
when the first signal has first logic level and the second signal has the second logic level, the second determining unit circuit generates the second output signal to make the connecting module be tested,
when the first signal and the second signal have the second logic level, and the fourth signal has the first logic level, the second determining unit circuit generates the second output signal to make the connecting module not be tested, and
when the first signal, the second signal, and the fourth input signal has the second logic level, the second determining unit circuit generates the second output signal to make the connecting module be tested.

13. The DRAM claim 10, wherein the second determining unit circuit comprises:
a third NAND gate having a first input port, a second input port, and an output port;
a fourth NAND gate having a first input port, a second input port, and an output port;
a third inverter having an input port and an output port; and
a fourth inverter having an input port and an output port,
wherein the first input port of the third NAND gate is coupled to the detector and configured to receive the first signal, the second input port of the third NAND gate is coupled to the output port of the third inverter, the output port of the third NAND gate is coupled to the second input port of the fourth NAND gate, the input port of the third inverter is configured to receive the fourth input signal, the first input port of the fourth NAND gate is coupled to the receiver and configured to receive the second signal, the output port of the fourth NAND gate is coupled to the input port of the fourth inverter, and the output port of the fourth inverter is configured to output the second output signal.

14. The DRAM of claim 1, wherein the first operation mode is 1N mode of double data rate fifth-generation synchronous dynamic random access memory (DDR5 SDRAM), and the second operation mode is 2N mode of DDR5 SDRAM.

15. A method, configured to control a dynamic random access memory (DRAM), comprising:
receiving, by an input/output (I/O) pad of a connecting module of the DRAM, a first input signal;
generating a first signal according to a voltage level of the first input signal and a voltage level of a reference signal; and
generating, according to the first signal, a first output signal to control the DRAM being operated under a first operation mode or a second operation mode,
wherein when the first output signal having a first logic level, the DRAM is controlled to be operated under the second operation mode, and when the first output signal having a second logic level, the DRAM is controlled to be operated under the first operation mode.

16. The method of claim 15, wherein generating the first signal according to the voltage level of the first input signal and the level of the reference signal comprises:
comparing the voltage level of the first input signal to the voltage level of the reference signal;
when the voltage level of the first input signal is lower than the voltage level of the reference signal, generating the first signal having the second logic level; and
when the voltage level of the first input signal is greater than the voltage level of the reference signal, generating the first signal having the first logic level.

17. The method of claim 16, wherein generating the first output signal comprises:
receiving a second input signal; and
generating a second signal according to the first signal and the second input signal.

18. The method of claim 17, wherein generating the first output further comprises:
receiving a third input signal;
generating a third signal according to the second signal and the third input signal; and
generating the first output signal according to the third signal,
wherein when the first input signal, the second input signal, and the third input signal have the first logic level, the DRAM is controlled to be operated under the second operation mode,
when the first signal having the first logic level, the second input signal having the second logic level, and the third input signal having the second logic level are achieved, the DRAM is controlled to be operated under the first operation mode,
when the first signal having the first logic level, the second input signal having the first logic level, and the third input signal having the second logic level are achieved, the DRAM is controlled to be operated under the first operation mode, and
when the first signal having the first logic level, the second input signal having the second logic level, and the third input signal having the first logic level are achieved, the DRAM is controlled to be operated under the first operation mode.

19. The method of claim 15, further comprising:
generating a second output signal according to the first input signal, comprising:
generating a fourth signal according to the first input signal;
receiving a fourth input signal;
generating a fifth signal according to the first signal, the fourth signal, and the fourth input signal; and
generating the second output signal according to the fifth signal,
wherein the connecting module is controlled to be tested according to the second output signal.

20. The method of claim 19, wherein
when the first signal and the fourth signal have the second logic level, the second output signal is generated to make the connecting module not be tested,
when the first signal has the second logic level and the fourth signal has the first logic level, the second output signal is generated to make the connecting module be tested, when the first signal, the fourth signal, and the fourth input signal have the first logic level, the second output signal is generated to make the connecting module be tested, and when the first signal and the fourth signal have the first logic level, and the fourth input signal has the second logic level, the second output signal is generated to make the connecting module not be tested.

\* \* \* \* \*